(12) United States Patent
Feng et al.

(10) Patent No.: US 11,490,524 B2
(45) Date of Patent: Nov. 1, 2022

(54) LIQUID METAL-BASED FLEXIBLE ELECTRONIC DEVICE AND PREPARATION METHOD AND USE THEREOF

(71) Applicant: Harbin Institute of Technology, Shenzhen, Shenzhen (CN)

(72) Inventors: Liang Feng, Shenzhen (CN); Yaming Liu, Shenzhen (CN); Huanhuan Feng, Shenzhen (CN); Li Wang, Shenzhen (CN); Yueyue Zhang, Shenzhen (CN); Zhenchao Zhang, Shenzhen (CN); Min Wang, Shenzhen (CN); Weiwei Zhao, Shenzhen (CN); Xing Ma, Shenzhen (CN); Jiaheng Zhang, Shenzhen (CN)

(73) Assignee: Harbin Institute of Technology, Shenzen (CN)

( * ) Notice: Subject to any disclaimer, the term of this patent is extended or adjusted under 35 U.S.C. 154(b) by 0 days.

(21) Appl. No.: 17/513,766

(22) Filed: Oct. 28, 2021

(65) Prior Publication Data

US 2022/0141963 A1    May 5, 2022

(30) Foreign Application Priority Data

Oct. 30, 2020  (CN) .......................... 202011187023.X

(51) Int. Cl.
*H05K 3/10* (2006.01)
*B33Y 80/00* (2015.01)
(Continued)

(52) U.S. Cl.
CPC ............. *H05K 3/107* (2013.01); *B29C 64/30* (2017.08); *B33Y 40/20* (2020.01); *C23C 14/205* (2013.01);
(Continued)

(58) Field of Classification Search
CPC .................. H05K 3/103; H05K 3/107; H05K 2203/1305; H05K 2203/1311;
(Continued)

(56) References Cited

U.S. PATENT DOCUMENTS

2003/0228485 A1* 12/2003 Yusa ...................... H05K 3/107
264/161

FOREIGN PATENT DOCUMENTS

| CN | 106817846 | | 6/2017 |
| CN | 107283859 | | 10/2017 |
| JP | 2014229820 | A * | 12/2014 |

OTHER PUBLICATIONS

D. Kim, Y. Yoon, S. K. Kauh and J. Lee, "Towards sub-microscale liquid metal patterns: Cascade phase change mediated pick-n-place transfer of liquid metals printed and stretched over a flexible substrate," 2018 IEEE Micro Electro Mechanical Systems (MEMS), 2018, pp. 463-466. (Year: 2018).*

* cited by examiner

*Primary Examiner* — A. Dexter Tugbang
(74) *Attorney, Agent, or Firm* — Fish IP Law, LLP

(57) ABSTRACT

Provided is a liquid metal-based flexible electronic device and a method for preparing a liquid metal-based flexible electronic device, that includes: preparing an Acrylonitrile Butadiene Styrene (ABS) plastic model; performing an ion sputtering on a surface of the ABS plastic model to form a gold film, to obtain a gold-plated ABS circuit; introducing a first silica gel into a mold to suspend the gold-plated ABS circuit inside the mold, and curing the first silica gel to obtain a cured model; immersing the cured model in acetone to dissolve the ABS model, to obtain a microchannel with a gold plating on an inner wall of the microchannel in a first silica gel substrate; and injecting a gallium-indium eutectic, inserting a copper wire, and applying a second silica gel and
(Continued)

curing the second silica gel, to obtain the liquid metal-based flexible electronic device.

6 Claims, 24 Drawing Sheets

(51) Int. Cl.
*B29C 64/30* (2017.01)
*B33Y 40/20* (2020.01)
*C23C 14/20* (2006.01)
*H05K 3/16* (2006.01)
*H05K 3/12* (2006.01)
*B29K 55/02* (2006.01)
*B29L 31/34* (2006.01)

(52) U.S. Cl.
CPC ............ *H05K 3/103* (2013.01); *H05K 3/125* (2013.01); *H05K 3/1241* (2013.01); *H05K 3/16* (2013.01); *B29K 2055/02* (2013.01); *B29L 2031/34* (2013.01); *B33Y 80/00* (2014.12); *H05K 3/105* (2013.01); *H05K 2203/1305* (2013.01); *H05K 2203/1311* (2013.01); *H05K 2203/1322* (2013.01)

(58) Field of Classification Search
CPC ............ H05K 2203/1322; H05K 3/16; H05K 3/1241; H05K 3/125; H05K 3/105; B33Y 80/00; B33Y 40/00; B29K 2205/02; B29C 64/30; B29L 2031/34; C23C 14/205
See application file for complete search history.

LIQUID METAL-BASED FLEXIBLE ELECTRONIC DEVICE AND PREPARATION METHOD AND USE THEREOF

This application claims the benefit and priority of Chinese Patent Application No. 202011187023.X, entitled "Liquid metal-containing flexible electronic device and preparation method and use thereof" filed with the Chinese National Intellectual Property Administration on Oct. 30, 2020, the disclosure of which is incorporated by reference herein in its entirety as part of the present application.

FIELD OF THE INVENTION

The present disclosure relates to the technical field of liquid metal-based flexible electronic device, and particularly to a liquid metal-based flexible electronic device and a preparation method and use thereof.

BACKGROUND

The background description includes information that may be useful in understanding the present invention. It is not an admission that any of the information provided herein is prior art or relevant to the presently claimed invention, or that any publication specifically or implicitly referenced is prior art.

Liquid metals, such as gallium-based and bismuth-based alloys, are a large class of emerging functional materials with unique physical and chemical properties. They are liquid at room temperature and have the properties of high boiling point, strong conductivity, high thermal conductivity, no needs of high-temperature smelting in their manufacturing process, environmental friendliness, and nontoxicity, and meanwhile low melting point which is not for conventional high melting point metal materials. Its molding ability in molten state creates conditions for quickly building different forms of functional devices, and it is very suitable for the manufacturing flexible electronic devices.

At present, the methods for preparing flexible electronic devices based on liquid metal mainly include (1) direct writing method: using a syringe or similar suction tools to extract a liquid metal ink, slowly injecting liquid metal into a clean empty refill, writing and drawing a circuit pattern on a substrate; (2) plane printing method: on the basis of direct writing method, in combination with a complete equipment which is composed of moving guide rail, digitally controlled module, print head and setting module, charging the liquid metal ink to the print head, performing a fast printing of electronic patterns on the substrate according to the control instructions issued by computer software; (3) ink jet printing method: placing liquid metal in an inkjet pen, in which, the liquid metal enters a nozzle from a container under the action of gravity, and spraying liquid metal out of the nozzle under the action of annular columnar air, and transferring a designed circuit pattern to the substrate through a mask of specific shape; (4) lithography: constructing a microchannel in the flexible substrate through lithography and other technologies, and making the circuit by injecting liquid metal into the microchannel through injection operation; (5) 3D (three-dimensional) printing method: printing a constructed object layer by layer and depositing a flexible substrate, a liquid metal ink, a flexible substrate in turn, which could avoid corrosion and contribute to environmental protection.

Direct writing, planar printing, and inkjet printing method could only construct traditional two-dimensional circuits. These two-dimensional circuits are formed by liquid metal films. When carrying high current density, fracture problems may be caused by the electromigration phenomenon. The construction of microchannels by lithography is cumbersome and costly, which is not suitable for large-scale application and promotion. The direct printing of flexible circuits with a 3D metal printer simplifies the manufacturing process and saves materials, but the cost of this 3D metal printer is still high.

SUMMARY OF THE INVENTION

In view of this, an object of the present disclosure is to provide a liquid metal-based flexible electron device and a preparation method thereof. According to the method of the present disclosure, a microchannel is quickly constructed in a flexible Ecoflex (silica gel) substrate, and a liquid metal is then injected into the microchannel, and thereby a flexible electronic device is fabricated, without the construction of microchannel(s) by traditional lithography process(es), which greatly simplifies the operations and reduces the cost.

In order to achieve the above object of the present disclosure, the present disclosure provides the following technical solutions:

The present disclosure provides a method for preparing a liquid metal-based flexible electronic device, comprising: preparing an ABS (Acrylonitrile Butadiene Styrene) plastic model by a 3D printing according to a circuit pattern; performing an ion sputtering on a surface of the ABS plastic model to form a gold film, to obtain a gold-plated ABS circuit; introducing Ecoflex into a mold, suspending the gold-plated ABS circuit inside the mold such that the gold-plated ABS circuit does not contact the mold, and curing Ecoflex, to obtain a cured model; immersing the cured model in acetone to dissolve the ABS plastic model, to obtain a microchannel with a gold plating on an inner wall of the microchannel in the Ecoflex substrate; and injecting a gallium-indium eutectic into the microchannel with a gold plating on the inner wall, inserting a copper wire into the liquid metal at both ends of the microchannel with a gold plating on the inner wall, and applying Ecoflex to a port of the microchannel with a gold plating on the inner wall and curing Ecoflex such that the circuit is encapsulated, to obtain the liquid metal-based flexible electronic device.

In some embodiments, the ion sputtering is performed for 60-100 s.

In some embodiments, curing Ecoflex is performed independently for 2 to 4 hours.

In some embodiments, immersing the cured model in acetone is performed for 12-24 hours.

In some embodiments, the gallium-indium eutectic has a Ga content of 74.5 wt %, and an In content of 25.5 wt %.

In some embodiments, the copper wire has a length of 50-70 mm.

The present disclosure also provides a liquid metal-based flexible electronic device, which is prepared by the method as described in the above technical solutions.

The present disclosure also provides use of the liquid metal-based flexible electronic device as described in the above technical solutions in the fields of smart furniture, smart wear, electronic skin, flexible sensing, radio frequency antennas, biomedicine, and aerospace.

The present disclosure provides a method for preparing a liquid metal-based flexible electron device, comprising the following steps: preparing an ABS plastic model by a 3D printing according to a circuit pattern; performing an ion sputtering on a surface of the ABS plastic model to form a gold film, to obtain a gold-plated ABS circuit; introducing Ecoflex into a mold, suspending the gold-plated ABS circuit inside the mold such that the gold-plated ABS circuit does not contact the mold, and curing Ecoflex, to obtain a cured model; immersing the cured model in acetone to dissolve the ABS plastic model, to obtain a microchannel with a gold plating on an inner wall of the microchannel in the Ecoflex substrate; injecting a gallium-indium eutectic into the microchannel with a gold plating on the inner wall, inserting a copper wire into the liquid metal at both ends of the microchannel with a gold plating on the inner wall, and applying Ecoflex to a port of the microchannel with a gold plating on the inner wall and curing Ecoflex such that the circuit is encapsulated, to obtain the liquid metal-based flexible electronic device. In the present disclosure, 3D printing and the characteristic that ABS plastic can be dissolved by acetone were utilized, and a microchannel is quickly constructed in the flexible substrate of Ecoflex, and liquid metal is then injected into the microchannel to complete the manufacturing of a flexible electronic device. In the inventive method, the construction of the microchannel by a traditional lithography process is not needed, which could greatly simplify the operation steps and reduce the cost.

The present disclosure also provides a liquid metal-based flexible electron device prepared by the method as described in the above technical solutions. In present disclosure, the gold film on the surface of ABS is transferred to the surface of a flexible Ecoflex substrate, which improves the wettability of liquid metal within the microchannel, thereby facilitating the subsequent liquid metal-injection operation. The prepared flexible liquid metal circuit has high elasticity, and could meet the needs of various deformations, and has stable electrical properties during service.

The adhesion work of microchannels at different stages was calculated according to the Young Dupre equation. The adhesion work after plating gold increases from 110 mJ/m$^2$ (before plating gold) to 200 mJ/m$^2$, which is increased by nearly twice, thereby significantly improving the wettability. The obtained liquid metal-based flexible electronic devices could be stretched to a strain of 600%, bent 180°, and twisted 360°, and when being subjected to 1,000-cycle tensile tests with a strain of 100%, exhibit stable peaks and valleys in the resistance curve.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

FIG. 18B of which represents after exercise.

DETAILED DESCRIPTION

The following discussion provides example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The present disclosure provides a method for preparing a liquid metal-based flexible electron device, comprising the following steps: preparing an ABS plastic model by a 3D printing according to a circuit pattern; performing an ion sputtering on a surface of the ABS plastic model to form a gold film, to obtain a gold-plated ABS circuit; introducing Ecoflex into a mold, suspending the gold-plated ABS circuit inside the mold such that the gold-plated ABS circuit does not contact the mold, and curing Ecoflex, to obtain a cured model; immersing the cured model in acetone to dissolve the ABS plastic model, to obtain a microchannel with a gold plating on an inner wall of the microchannel in the Ecoflex substrate; and injecting a gallium-indium eutectic into the microchannel with a gold plating on the inner wall, inserting a copper wire into the liquid metal at both ends of the microchannel with a gold plating on the inner wall, and applying Ecoflex to a port of the microchannel with a gold plating on the inner wall and curing Ecoflex such that the circuit is encapsulated, to obtain the liquid metal-based flexible electronic device.

Figure 1:
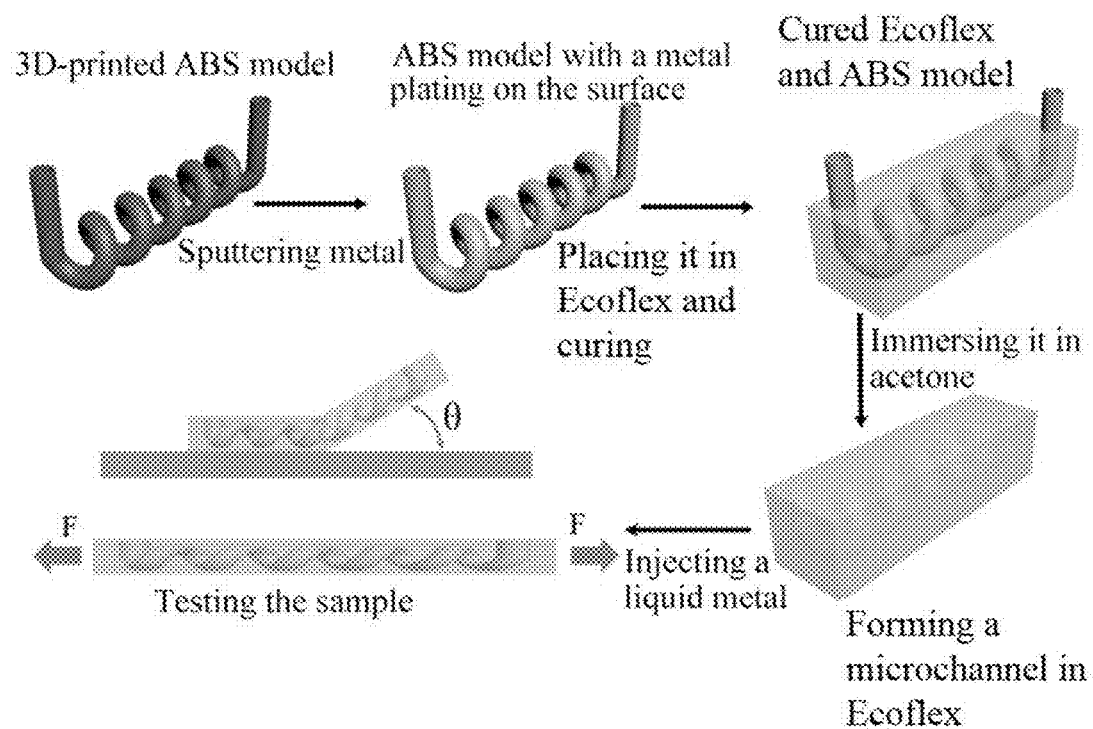
FIG. 1 shows a flowchart of the method for preparing the liquid metal-based flexible electron device according to one embodiment of the present disclosure.

FIG. 1 shows a flowchart of the method for preparing the liquid metal-based flexible electron device according to one embodiment of the present disclosure.

According to the circuit pattern, the ABS plastic model is prepared by 3D printing. In the present disclosure, there is no special limitation on the specification of the ABS plastic model. In some embodiments, it is designed according to the required circuit pattern. In the present disclosure, there is no special limitation on the specific means for the 3D printing, as long as an ABS plastic model could be obtained.

After obtaining the ABS plastic model, according to the present disclosure, an ion sputtering is performed on the surface of the ABS plastic model to form a gold film, to obtain a gold-plated ABS circuit. In the disclosure, the gold film is to improve the wettability of the gallium-indium eutectic in the microchannel, thereby facilitating the fabrication of the circuit.

In some embodiments of the present disclosure, the ion sputtering is performed for 60-100 seconds.

According to the present disclosure, Ecoflex is introduced into a mold, and then the gold-plated ABS circuit is suspended inside the mold such that the gold-plated ABS circuit does not contact the mold. Ecoflex is cured, to obtain a cured model. In some embodiments of the present disclosure, the Ecoflex is a commercial commodity produced by Smooth-On factory in the United States. In some embodiments of the present disclosure, the mold is made of polylactic acid (PLA).

In the present disclosure, suspending the gold-plated ABS circuit is to ensure that the gold-plated ABS circuit is completely covered by Ecoflex.

In some embodiments of the present disclosure, curing Ecoflex is performed for 2-4 hours. In the present disclosure, there is no special limitation on the specific means for curing, and specifically, it may be cured by standing at room temperature.

After obtaining the cured model, according to the present disclosure, the cured model is immersed in acetone to dissolve the ABS plastic model, to obtain a microchannel with a gold plating on an inner wall of the microchannel in the Ecoflex substrate.

In some embodiments of the present disclosure, immersing the cured model in acetone is performed for 12-24 hours.

In some embodiments of the present disclosure, dissolving the ABS plastic model is performed under an ultrasonic condition.

After obtaining the microchannel with a gold plating on the inner wall, according to the present disclosure, a gallium-indium eutectic is injected into the microchannel with a gold plating on the inner wall, and then a copper wire is inserted into the liquid metal at both ends of the microchannel with a gold plating on the inner wall. Ecoflex is then applied to a port of the microchannel with a gold plating on the inner wall, and cured such that the circuit is encapsulated, to obtain the liquid metal-based flexible electron device.

In some embodiments of the present disclosure, the gallium-indium eutectic has a GA content of 74.5 wt %, and an In content of 25.5 wt %. In some embodiments of the present disclosure, the gallium-indium eutectic is extracted by using a syringe and injected inward from one end of the microchannel.

In the present disclosure, the copper conductor has a length of 50-70 mm, and preferably 60 mm.

In the present disclosure, there is no special limitation on the amount of the Ecoflex to be applied, as long as the microchannel with a gold plating on the inner wall could be encapsulated. In some embodiments of the present disclosure, curing the applied Ecoflex is performed for 2-4 hours. In the present disclosure, there is no special limitation on the specific means for curing, and specifically, it may be cured by standing at room temperature.

The present disclosure also provides a liquid metal-based flexible electron device as prepared by the method according to the above technical solutions. In the present disclosure, the gold film is transferred from the surface of ABS to the surface of the flexible Ecoflex substrate, which improves the wettability of liquid metal within the microchannel, thereby facilitating the subsequent liquid metal-injection operation. The prepared flexible liquid metal circuit has high elasticity, and could meet the needs of various deformations, and has stable electrical performance during service.

The present disclosure also provides use of the liquid metal-based flexible electronic device as described in the above technical solutions in the fields of intelligent furniture, intelligent wear, electronic skin, flexible sensing, radio frequency antenna, biomedicine, and aerospace. In the present disclosure, there is no special limitation on the specific means of the use, and any means well known to those skilled in the art may be adopted.

In order to further illustrate the present disclosure, the liquid metal-based flexible electron device according to the present disclosure, a preparation method and use thereof are described in detail below in conjunction with examples, but they could not be understood as limiting the scope of the present disclosure.

Example 1

A circuit pattern was drawn by using the relevant software in the computer, and the ABS plastic model was printed with a 3D printer. The printed ABS plastic model was placed in an ion sputtering instrument and an ion sputtering was performed for 60 seconds. A layer of gold film was plated on its surface. Ecoflex was introduced into a mold, and then the gold-plated ABS circuit was suspended inside the mold. They were stood at room temperature for 2 hours, to be cured. The cured model (including cured Ecoflex and ABS model) was immersed in an acetone solution for 12 hours, and the ABS model was dissolved in acetone, After ABS was completely dissolved, Ecoflex was taken from the acetone solution, and rinsed, to obtain a microchannel with a gold plating on the inner wall in the Ecoflex substrate. A gallium-indium eutectic (EGaIn consists of 74.5 wt % of Ga and 25.5 wt % of In) was extracted by using a syringe and injected inward from one end of the microchannel. A copper wire having a length of 60 mm was taken and inserted into the liquid metal at both ends of the microchannel. Ecoflex was dropped to a port of the microchannel and cured such that the circuit was encapsulated, obtaining a liquid metal-based flexible electronic device.

Comparative Example Without a Gold Plating

In the comparative example, the method was the same as that of Example 1, except that the ABS plastic model was not plated with a gold film.

Figure 2A:
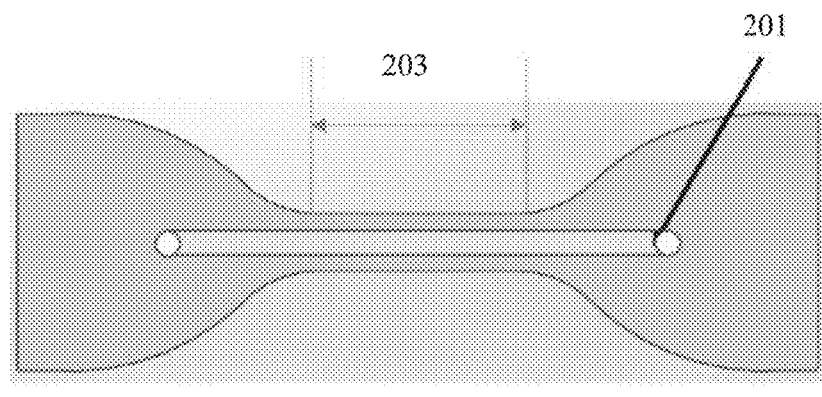
FIGS. 2A-2B show shapes and structures of the liquid metal-based flexible electron devices obtained in Example 1 and Comparative Example.
Figure 2B:
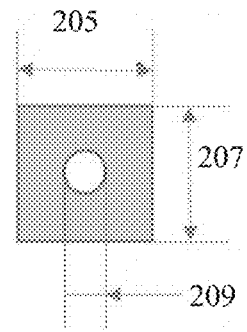

The shapes and structures of the liquid metal-based flexible electronic devices obtained in Example 1 and the Comparative Example are shown in FIGS. 2A-2B. It shows a dumbbell-shaped standard tensile part, with a small middle and large ends. The narrowest portion of the sample 203 has a length of 20 mm as shown in FIG. 2A. The cross-sectional shape shown in FIG. 2B is a square with side lengths 205 and 207 of 5 mm, and there are circular microchannels with five contemplated different sizes 209 in the middle, i.e. 0.4 mm, 0.6 mm, 0.8 mm, 1.0 mm, and 1.2 mm. The microchannel 201 filled with EGaIn liquid metal constitutes the circuit.

Figure 3:
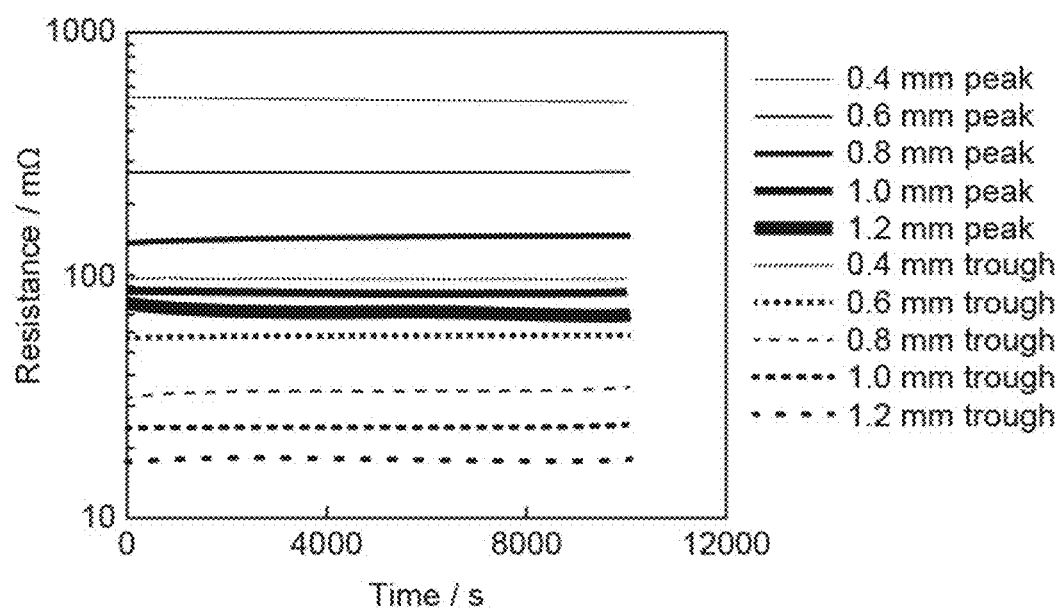
FIG. 3 shows a summary of peaks and troughs after 1,000 cycles (with a strain of 100%) of the liquid metal-based flexible electronic devices prepared in Example 1.
Figure 4A:
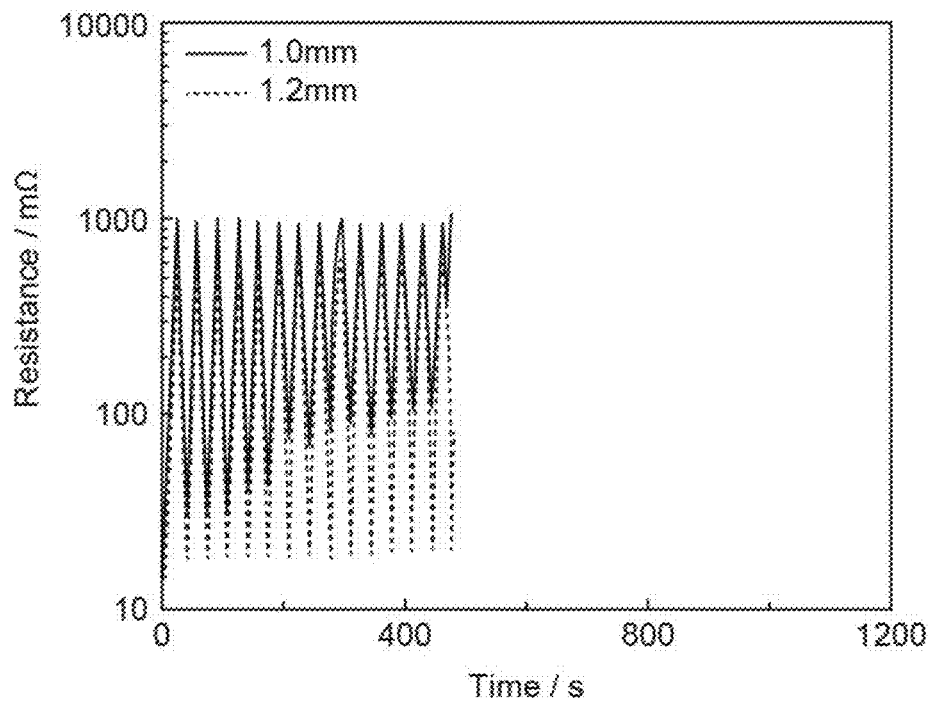
FIGS. 4A-4B show resistance curves of the liquid metal-based flexible electronic devices prepared in Example 1 and Comparative example in a tensile cycle with a strain of 600%, FIG. 4A for Comparative Example and FIG. 4B for Example 1.
Figure 4B:
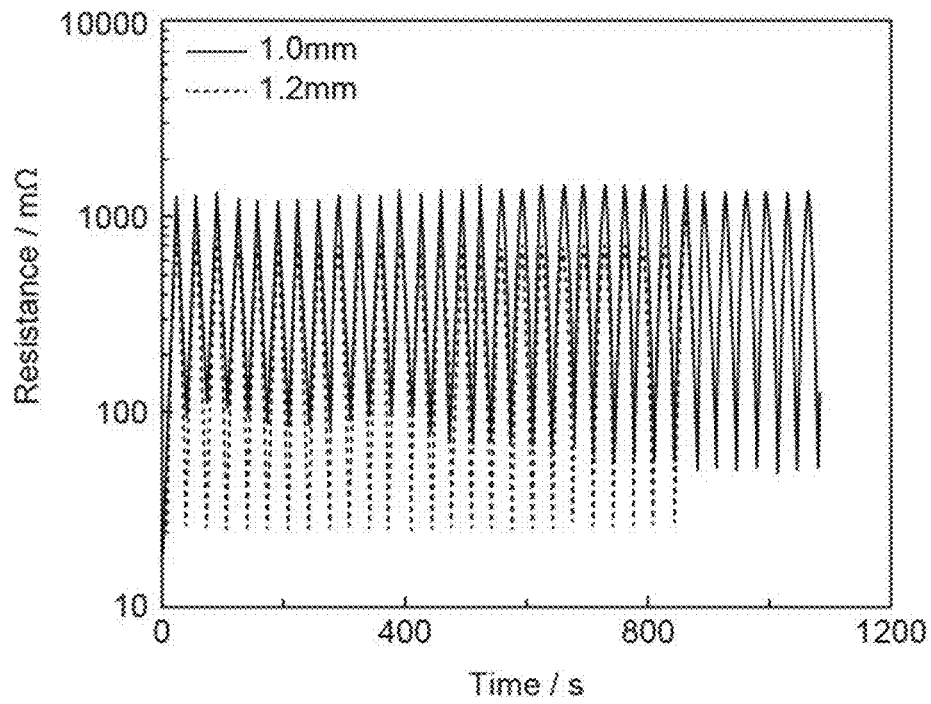

The prepared liquid metal-based flexible electronic devices were subjected to two tensile ultimate tests. In the first test, the liquid metal-based flexible electronic devices with five different sizes prepared in Example 1 were placed on a stepping platform and subjected to a 1000-time tensile cycle test with a strain of 100%. The variation curves of resistance during the cycle are shown in FIG. 3. As shown in FIG. 3, the peak represents the circuit resistance measured when the circuit is stretched to a strain of 100%, and the trough represents the circuit resistance measured when the circuit returns to its original length. After 1,000 cycles, the peaks and troughs of these circuits with five different microchannel sizes are still very stable. All of them have passed through the test completely. It indicates that the circuit made by the template method could withstand the tensile cycle with a low strain, and thus the circuit could be applicable to a low-strain tensile application in daily life. In the second ultimate test, the circuits with a microchannel size of 1.0 mm and 1.2 mm were subjected to a resistance test under cyclic tensile with a strain of 600%, each microchannel size with two cases: with a gold plating on the inner wall and without a gold plating on the inner wall. The resistance curves under tensile are shown in FIGS. 4A-4B, and FIG. 4A represents the case without a gold plating, i.e. the Comparative Example, and FIG. 4B represents the case with a gold plating, i.e. Example 1. The circuits of both sizes in the case without a gold plating have only achieved 13 cycles, while circuits 1.0 mm in size with a gold plating have achieved 31 cycles, and circuits 1.2 mm in size with a gold plating have achieved 26 cycles, which is at least twice than the former without a gold plating, indicating that the gold plating on the inner wall of the microchannel could significantly improve the stability of the circuit and could withstand more cycles of stretching with a higher strain.

Figure 5A:
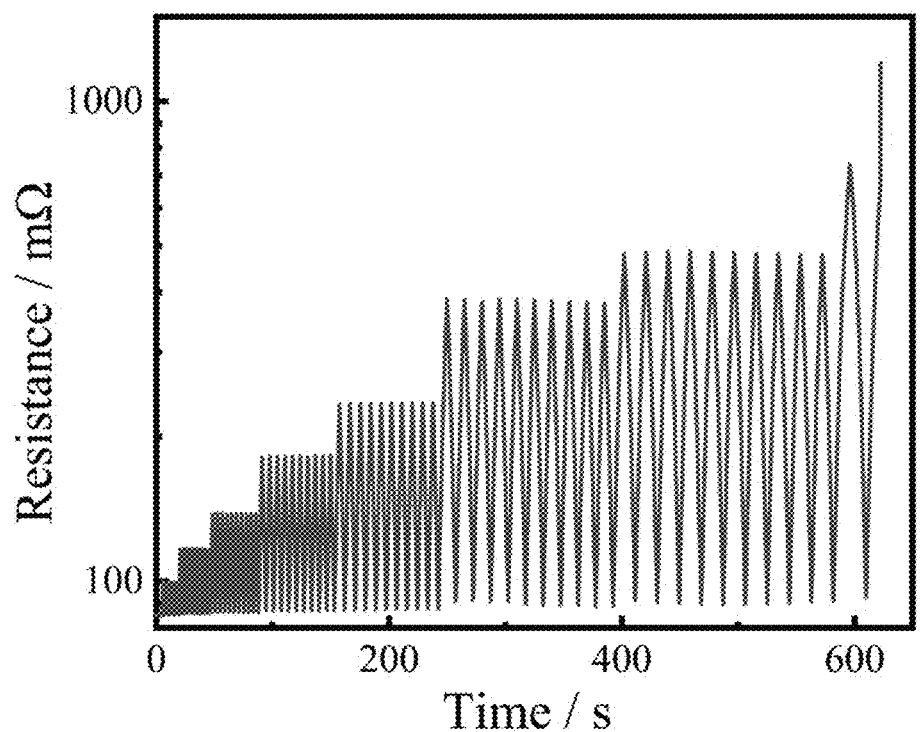
FIGS. 5A-5E show resistance curves of the liquid metal-based flexible electronic devices with different microchannel sizes prepared in Example 1 in a tensile cycle, FIG. 5A for 0.4 mm, FIG. 5B for 0.6 mm, FIG. 5C for 0.8 mm, FIG. 5D for 1.0 mm, and FIG. 5E for 1.2 mm.
Figure 5B:
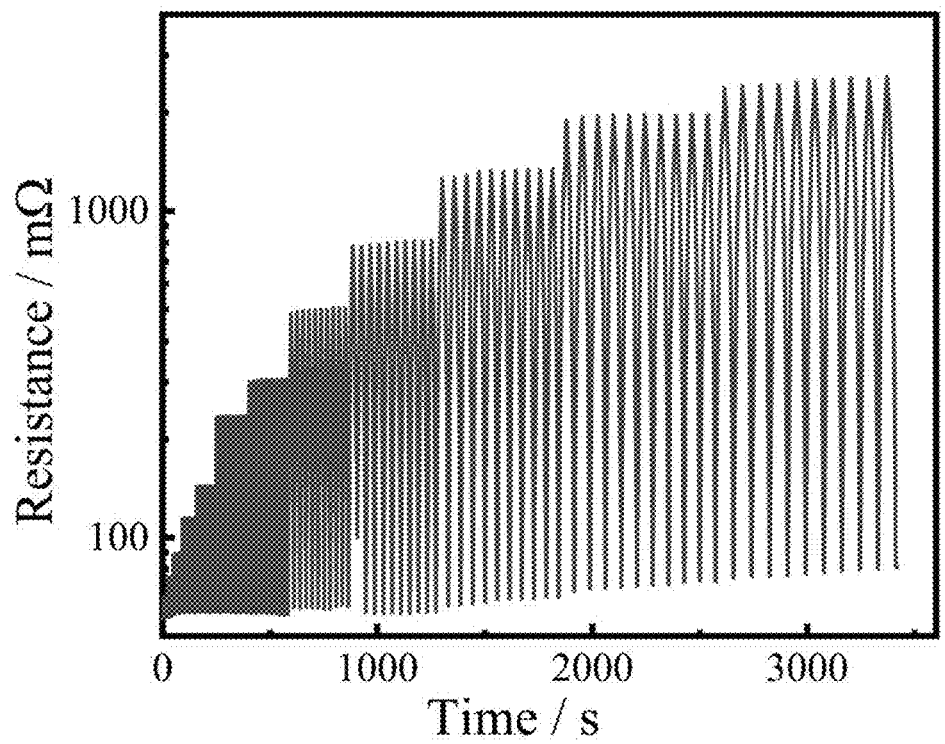
Figure 5C:
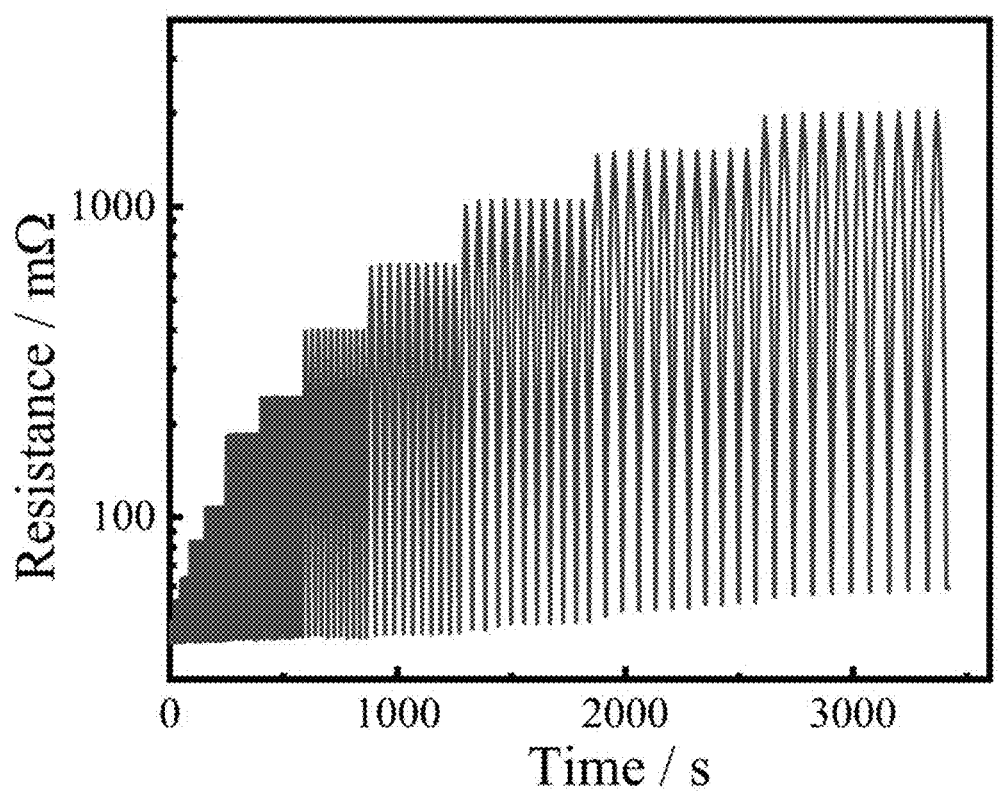
Figure 5D:
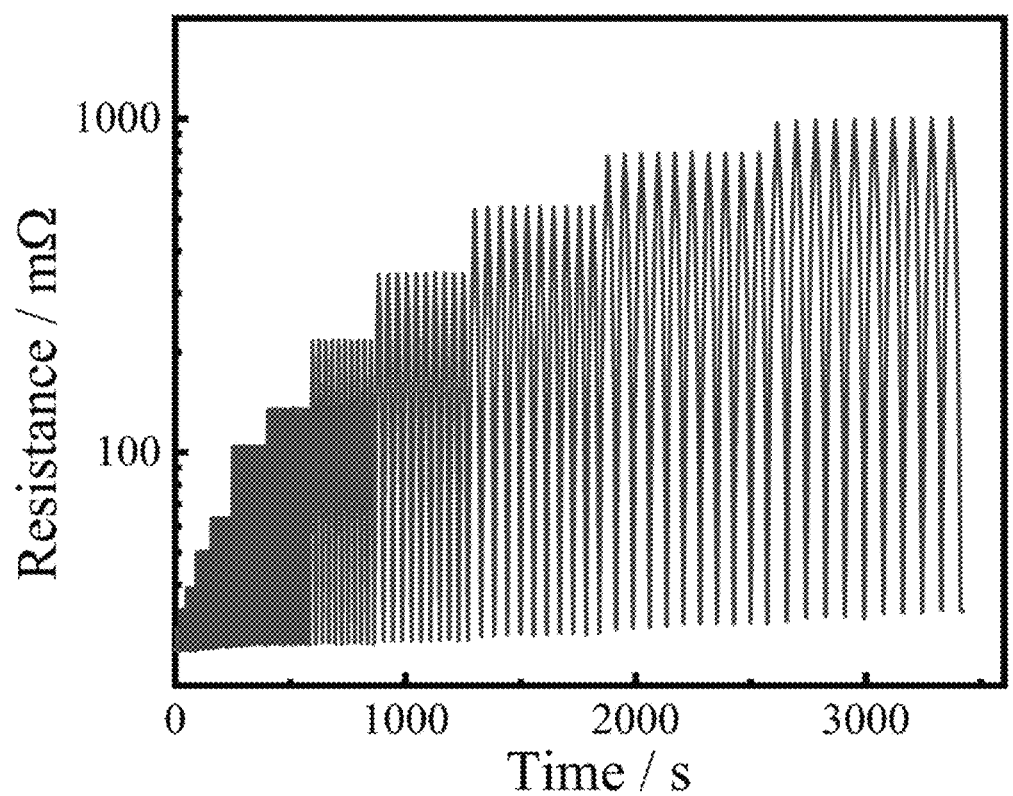
Figure 5E:
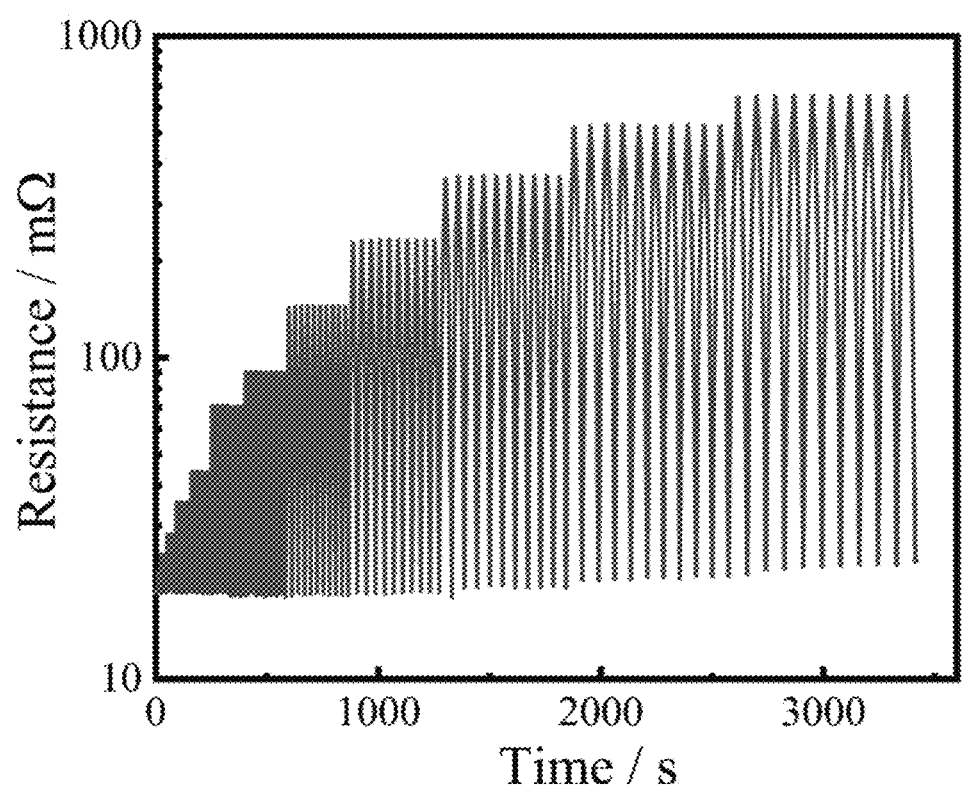

The liquid metal-based flexible electronic devices prepared in Example 1 were subjected to a resistance test under cyclic tensile from a low strain to a high strain, in which the sizes of the microchannels were 0.4 mm, 0.6 mm, 0.8 mm, 1.0 mm, and 1.2 mm, and the range of the strain was set to 10%, 20%, 30%, 50%, 70%, 100%, 150%, 200%, 300%, 400%, 500% and 600%, 10 cycles of stretching for each strain. The variation curve of the measured resistance during the stretching versus time is shown in FIGS. 5A-5E, FIG. 5A for 0.4 mm; FIG. 5B for 0.6 mm; FIG. 5C for 0.8 mm; FIG. 5D for 1.0 mm; FIG. 5E for 1.2 mm. It can be seen from FIGS. 5A-5E that circuits with microchannels 0.6 mm, 0.8 mm, 1.0 mm, and 1.2 mm in size completely passed through the cycle test without the occurrence of any open circuit, and both of the peaks and troughs of the circuits are stable at low strain or high strain. However, for the circuit which is 0.4 mm in size, the cycle is ended at about 600 s when the strain reaches 200%, and the resistance tends to infinity, that is to say, an open circuit occurs. This should be because the stability decreases due to a smaller size of the circuit. The EGaIn in the microchannel is squeezed and pushed by the Ecoflex substrate of the circuit during the multi-time cyclic stretching, so that the distribution of EGaIn is no longer uniform, low content in some areas and high content in another areas. Finally, when the circuit is stretched to a large deformation, the cross-sectional area of the microchannel also decreases rapidly. Thus, the continuous state of EGaIn liquid metal is broken at the place where its content is low, and the connection could not be maintained, eventually resulting in an open circuit. For circuits with a microchannel in a larger size, because of a larger volume of EGaIn liquid metal inside, even if a large deformation occurs, the squeezing of the EGaIn by the substrate would not be able to break it, and thus an open circuit would not occur.

Figure 6:
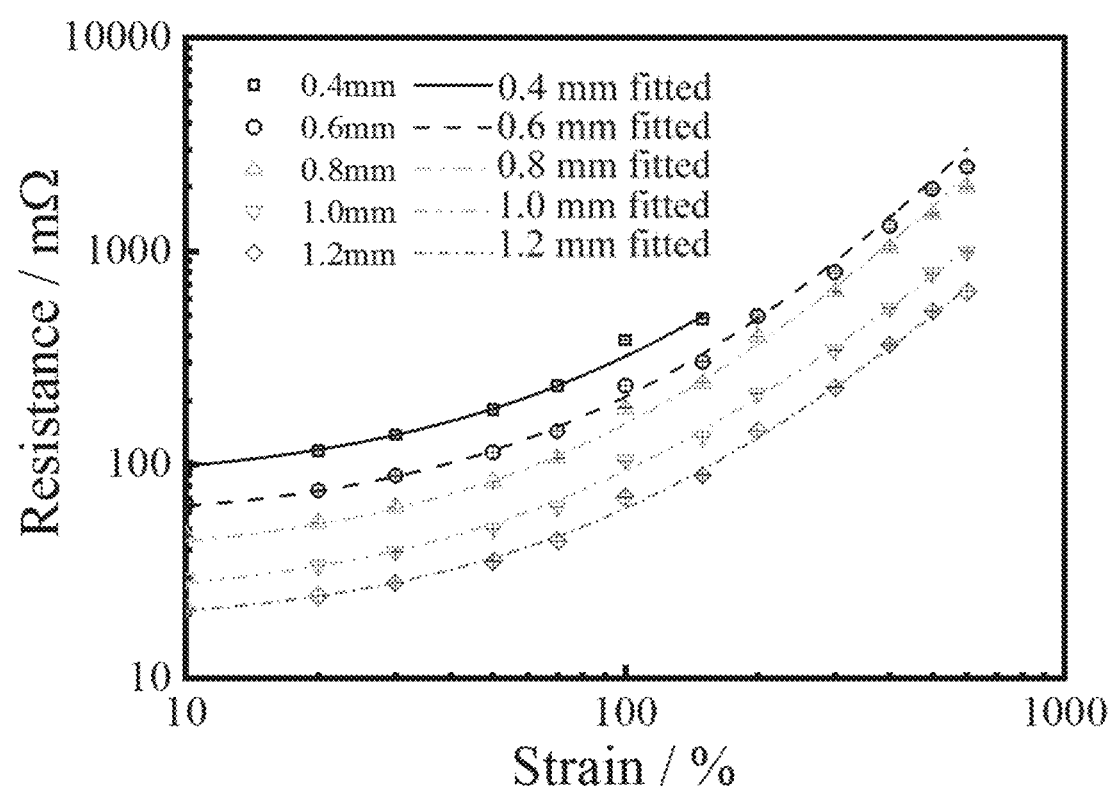
FIG. 6 shows the curve of peak resistances of the liquid metal-based flexible electronic devices with different microchannel sizes prepared in Example 1 versus strains.
Figure 7:
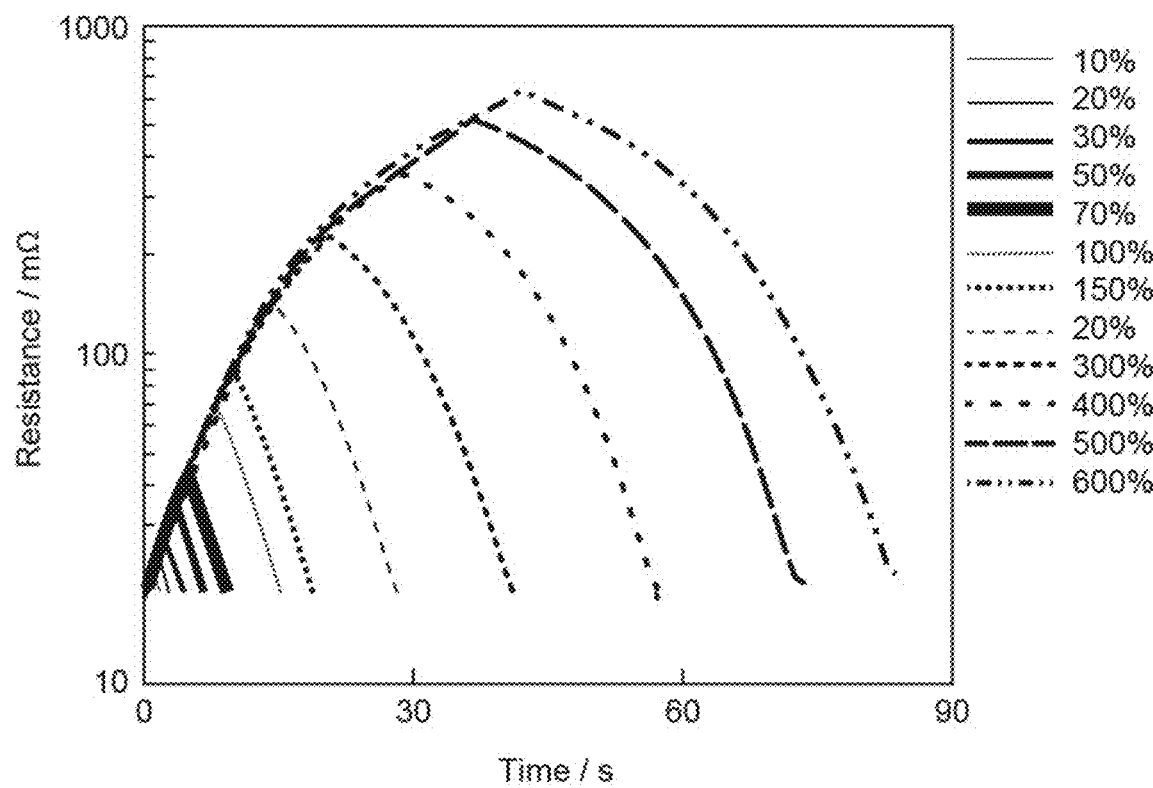
FIG. 7 shows a summary of resistance curves of the liquid metal-based flexible electronic device with a microchannel 1.2 mm in size, as prepared in Example 1, in a single tensile of each strain.

The peak resistance for each strain was summarized. The summarized data was fitted from the initial value of the circuit according to the above derived formula to obtain a summary of the fitted curve and actual peak values, as shown in FIG. 6. From FIG. 6, it can be seen that the actual resistances measured for five microchannel sizes are in good agreement with the curve fitted according to the formula, and basically all points fall on the curve. This proves that the experimental results are basically consistent with the deduced theory. The circuit resistance during the stretching varies according to the formula. Additionally, the single stretching-recovering process for each strain in the resistance curve under tensile for circuit having a microchannel 1.2 mm in size was statistically observed, as shown in FIG. 7. From FIG. 7, it can be seen that the curves of circuit resistance under tensile for strains ranging from 10% to 600% basically overlap, and the tensile and recovery processes for each strain are basically symmetrical. This also shows that the circuit resistance changes stably and changes in conformation with the deduced formula.

Figure 8:
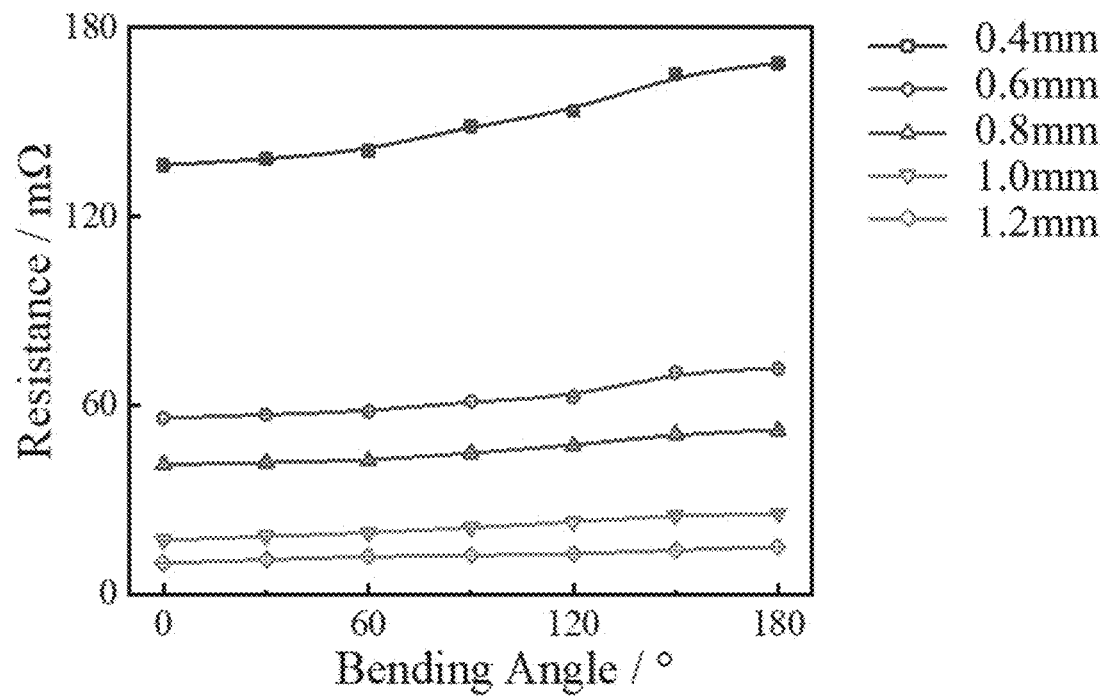
FIG. 8 shows curves of circuit resistance of the liquid metal-based flexible electronic devices with different microchannel sizes as prepared in Example 1 versus the bending angle.

The liquid metal-based flexible electronic devices prepared in Example 1 were placed on models bent in different angles and subjected to a resistance measurement with a multimeter, in which the angles were 0°, 30°, 60°, 90°, 120°, 150° and 180°. The results are shown in FIG. 8. From FIG. 8, it can be seen that as the bending angle of the circuit increases from 0° to 180°, the circuit resistance is also increasing. However, for microchannels with different sizes, and the increase in resistance also varies. For the circuit with a microchannel 0.4 mm in size, the resistance increased from 135 mΩ at 0° to 167 mΩ at 180°, while for the circuit with a microchannel 1.2 mm in size, the resistance only increased from 10 mΩ to 14 mΩ, indicating that the increase in resistance is larger when the size of the microchannel is smaller. The stretching of Ecoflex during bending also causes EGaIn liquid metal in the microchannel to be stretched, thereby increasing the resistance. Further, when the microchannel is in a smaller size, the same bending angle would have a greater impact on the circuit. Therefore, circuits with different microchannel sizes could be applied to different applications as needed.

Figure 9:
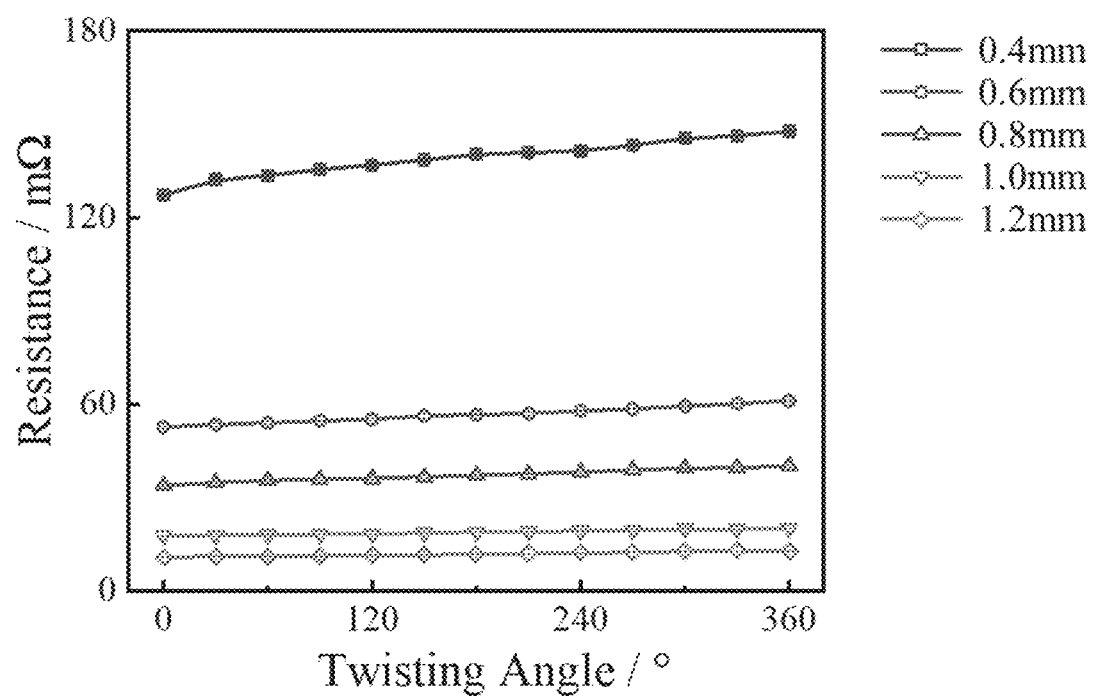
FIG. 9 shows curves of the circuit resistance of the liquid metal-based flexible electronic devices with different microchannel sizes as prepared in Example 1 versus the twisting angle.
Figure 10:
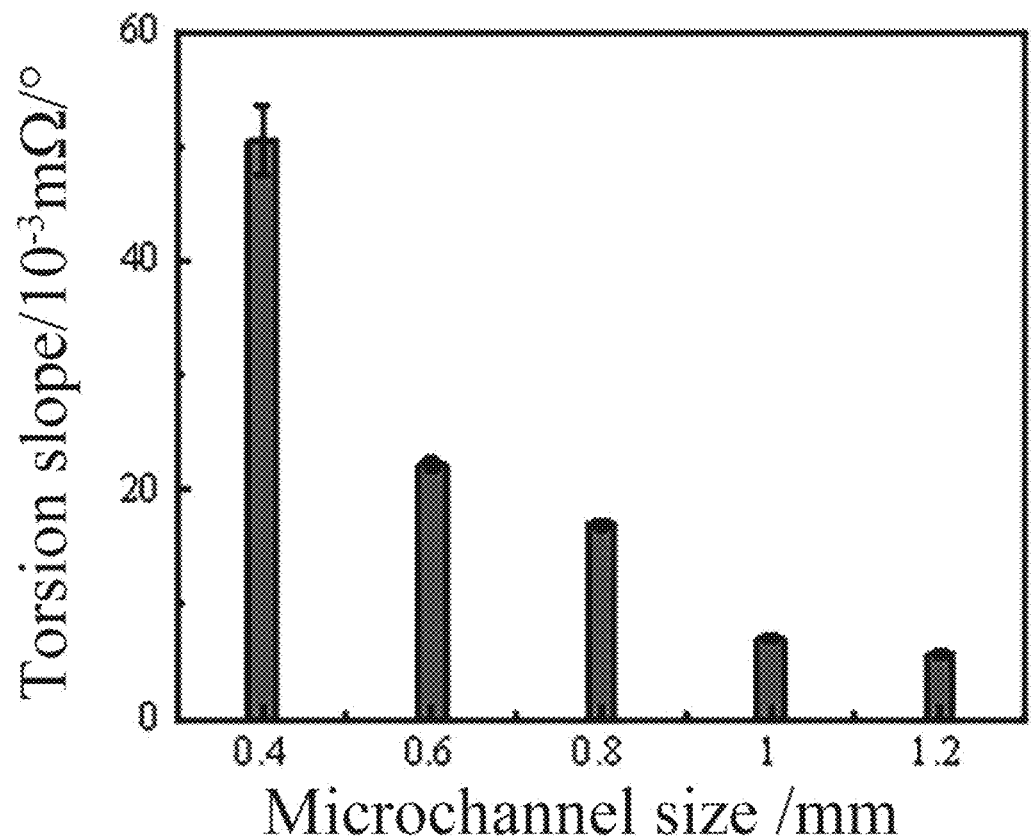
FIG. 10 shows slopes of the variation curve of the liquid metal-based flexible electronic devices with different microchannel sizes as prepared in Example 1.

The liquid metal-based flexible electronic devices prepared in Example 1 were placed on a fixture and twisted, in which the twisting angles θ are 0°, 30°, 60°, 90° . . . 330° and 360°, respectively. The resistances of circuits were measured with a multimeter. The results are shown in FIG. 9. From FIG. 9, it can be seen that the resistances of circuits increase as the twisting angle of the circuit increases from 0° to 360°, and that the curves are almost linear. However, for the microchannels of different sizes, the increases in the resistance vary. The resistance of circuit with a microchannel 0.4 mm in size increases from 127 mΩ at 0° to 147 mΩ at 360°, while the resistance of circuit with a microchannel 1.2 mm in size only increases from 10 mΩ to 12 mΩ, which is consistent with the situation of bending, i.e. the increase in resistance is larger when the size of the microchannel is smaller. However, the increase when twisting is much less than the increase when bending. When the substrate Ecoflex silicone of the circuit is twisted, the microchannel twists and squeezes the EGaIn liquid metal inside, thereby reducing the cross-sectional area, and thus the resistance is increased. Further, when the microchannel is in a smaller size, it has a higher sensitivity to this deformation, and thus the change of the resistance is greater. The slope of the curve in the figure was further analyzed, and summarized in FIG. 10. It can be seen from FIG. 10 that when the microchannel is in a smaller size, the torsion slope of the resistance is larger, indicating that the circuit resistance is more sensitive to torsional deformation, that is to say, it has a higher sensitivity.

Figure 11:
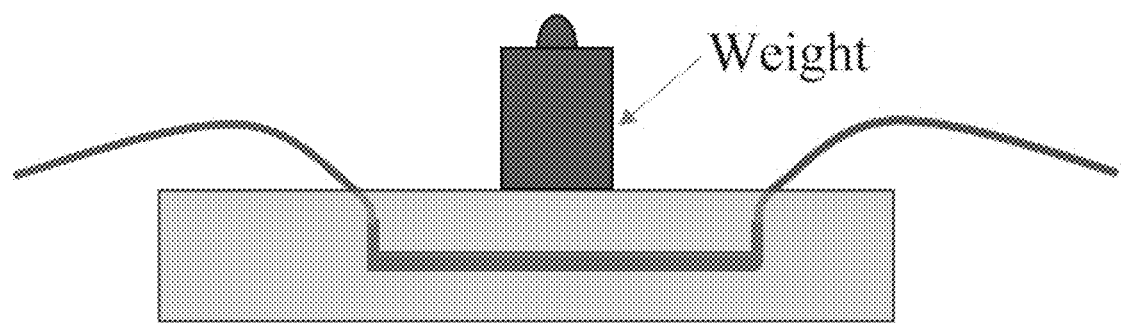
FIG. 11 shows a schematic diagram of the circuit voltage test.
Figures 12A, 12B, 12C:
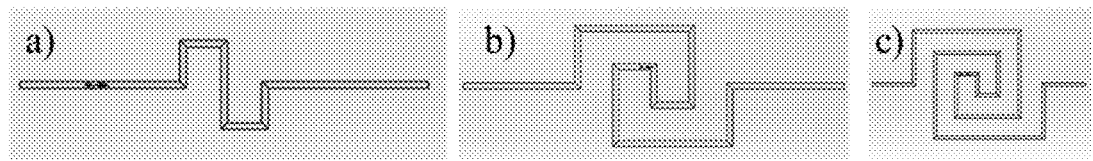
FIGS. 12A-12C show three circuit patterns of different complexity.
Figure 13A:
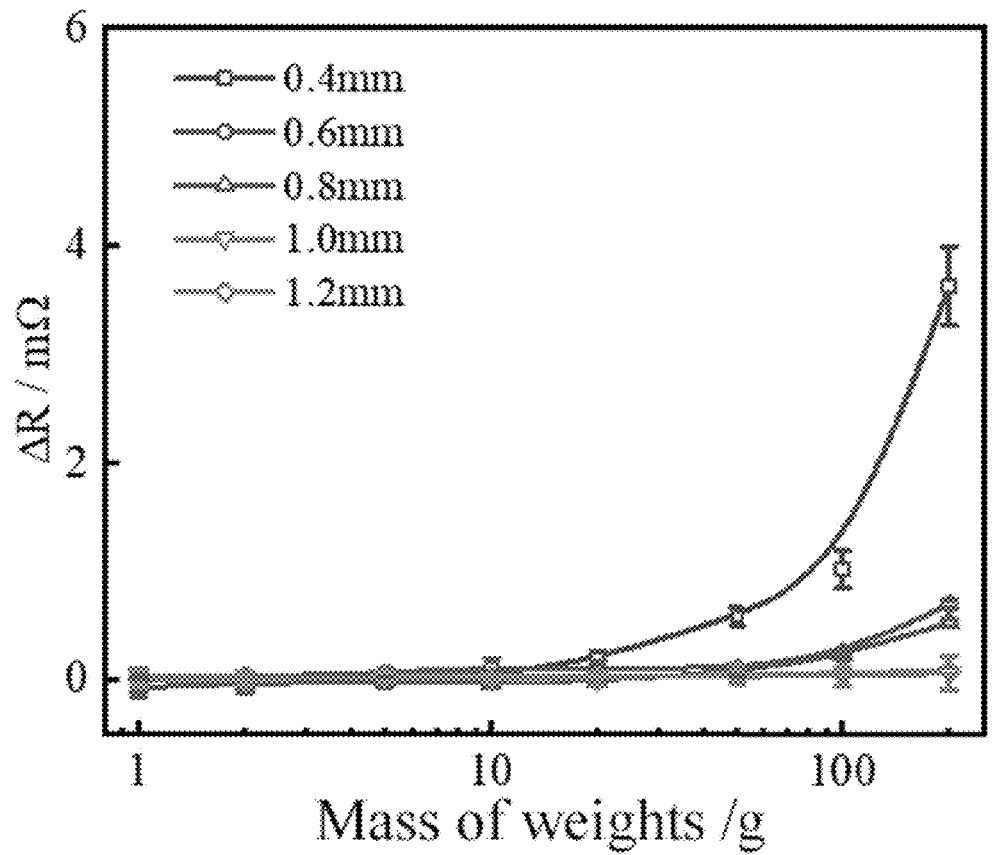
FIGS. 13A-13C show variations of circuit resistance versus the mass of weights when the liquid metal-based flexible electronic devices with different microchannel sizes prepared in Example 1 are configured in the simple-pattern circuit with Ecoflex of different thicknesses, FIG. 13A for 0.4 mm, FIG. 13B for 0.7 mm, and FIG. 13C for 1.0 mm.
Figure 13B:
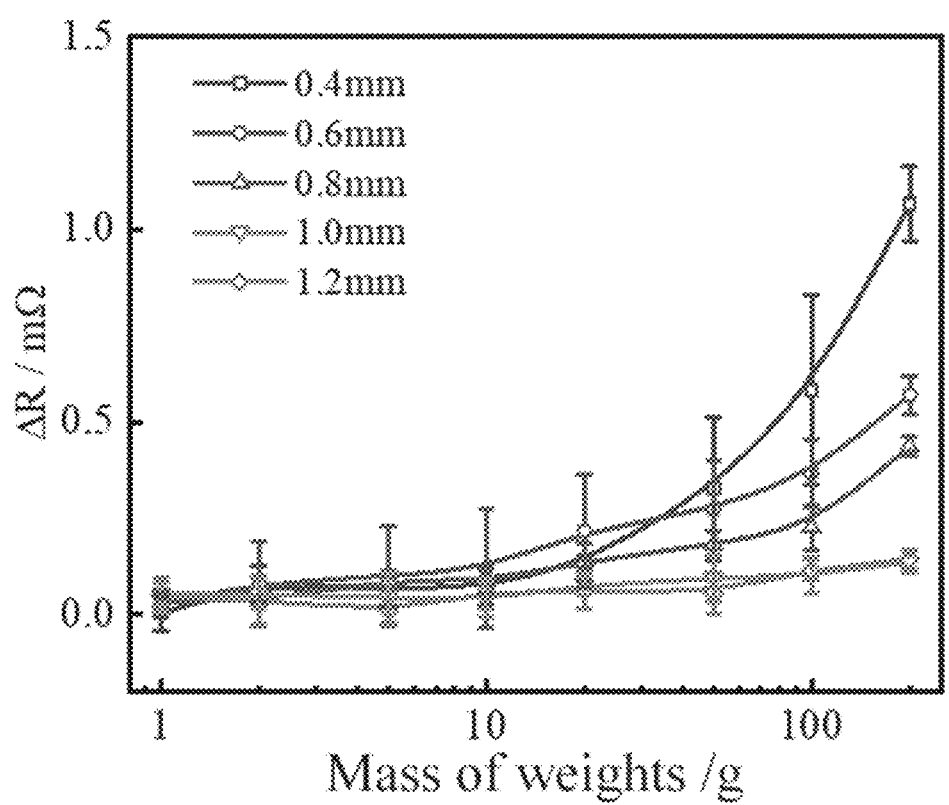
Figure 13C:
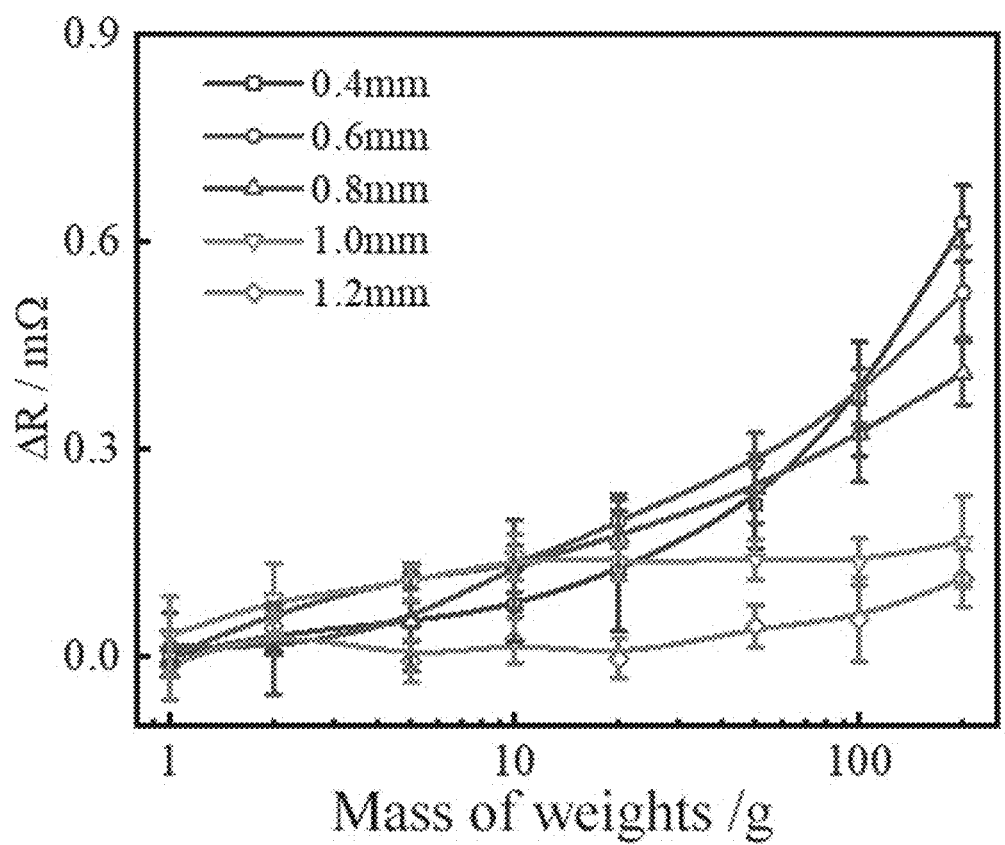
Figure 14A:
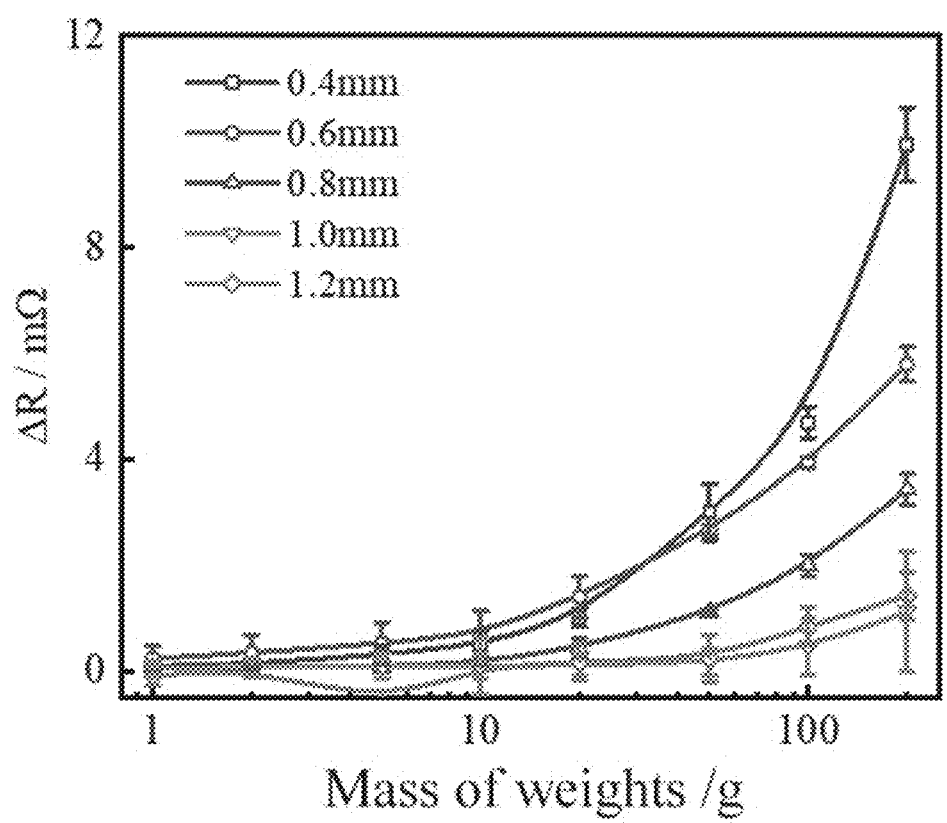
FIGS. 14A-14C show variations of circuit resistance versus the mass of weights when the liquid metal-based flexible electronic devices with different microchannel sizes prepared in Example 1 are configured in the complex-pattern circuit with Ecoflex of different thicknesses, FIG. 14A for 0.4 mm, FIG. 14B for 0.7 mm, and FIG. 14C for 1.0 mm.
Figure 14B:
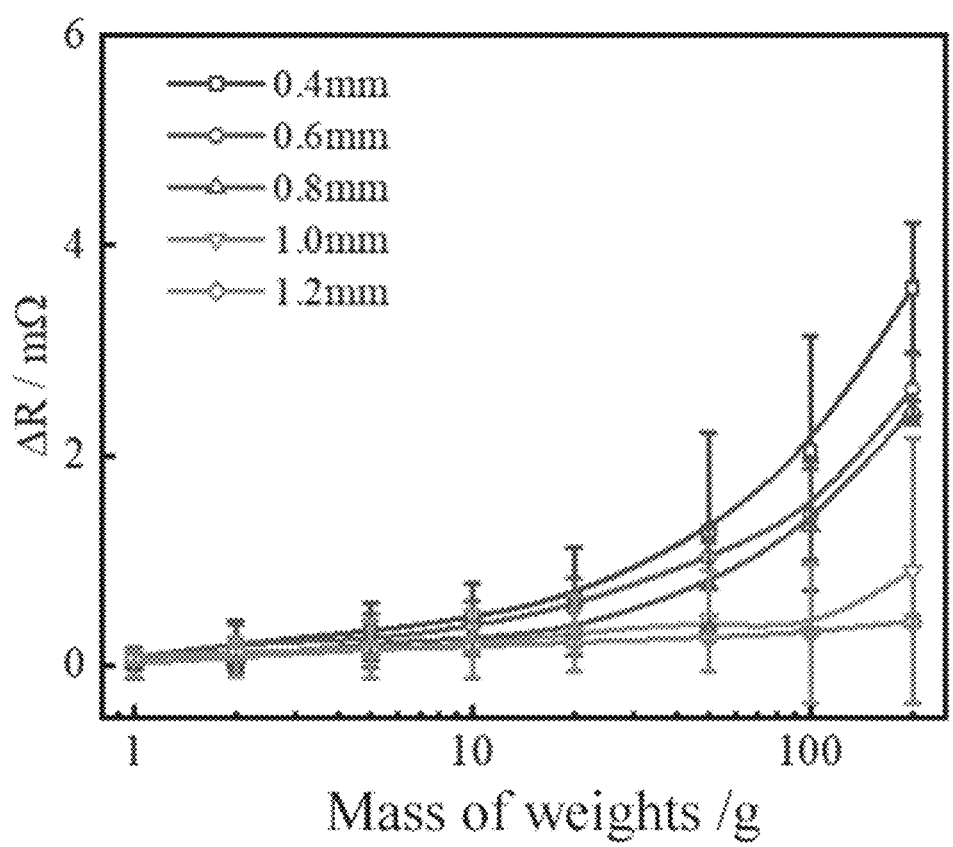
Figure 14C:
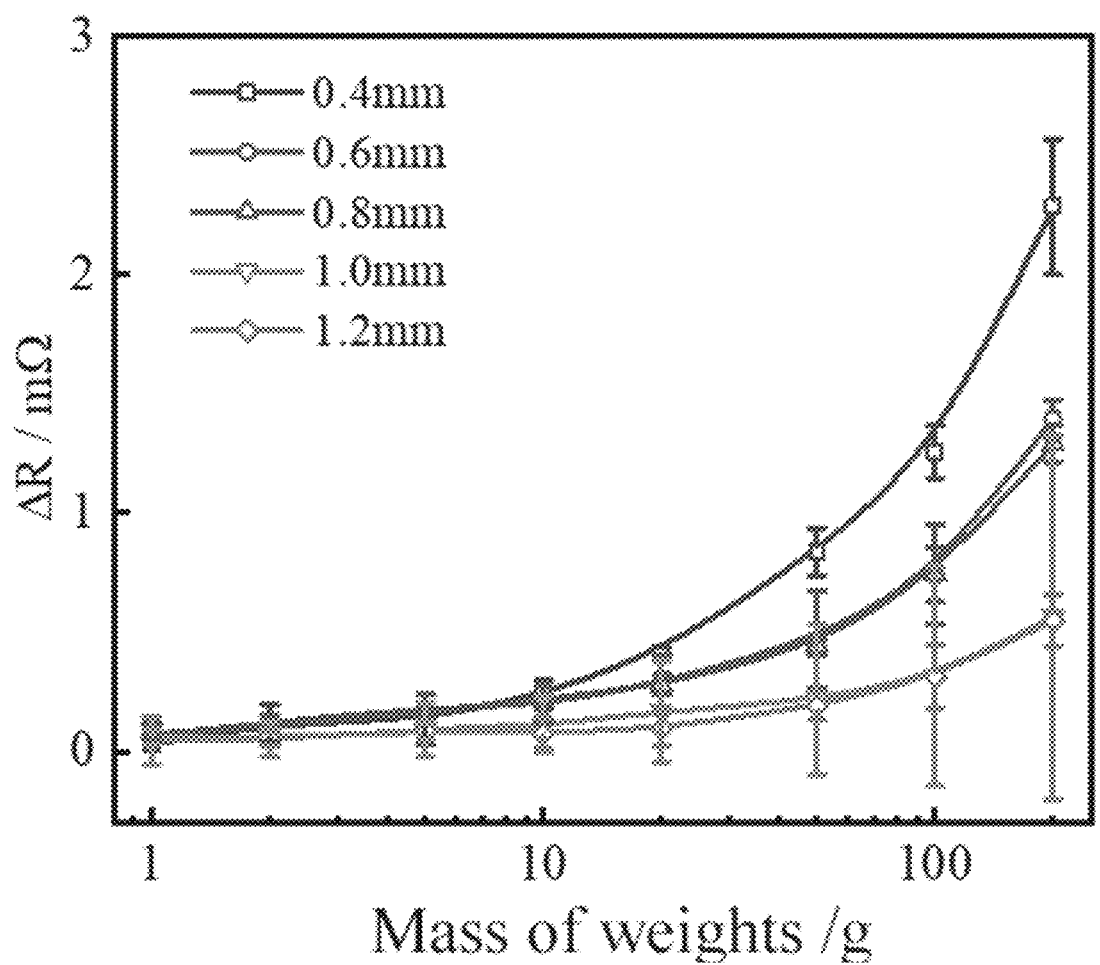
Figure 15A:
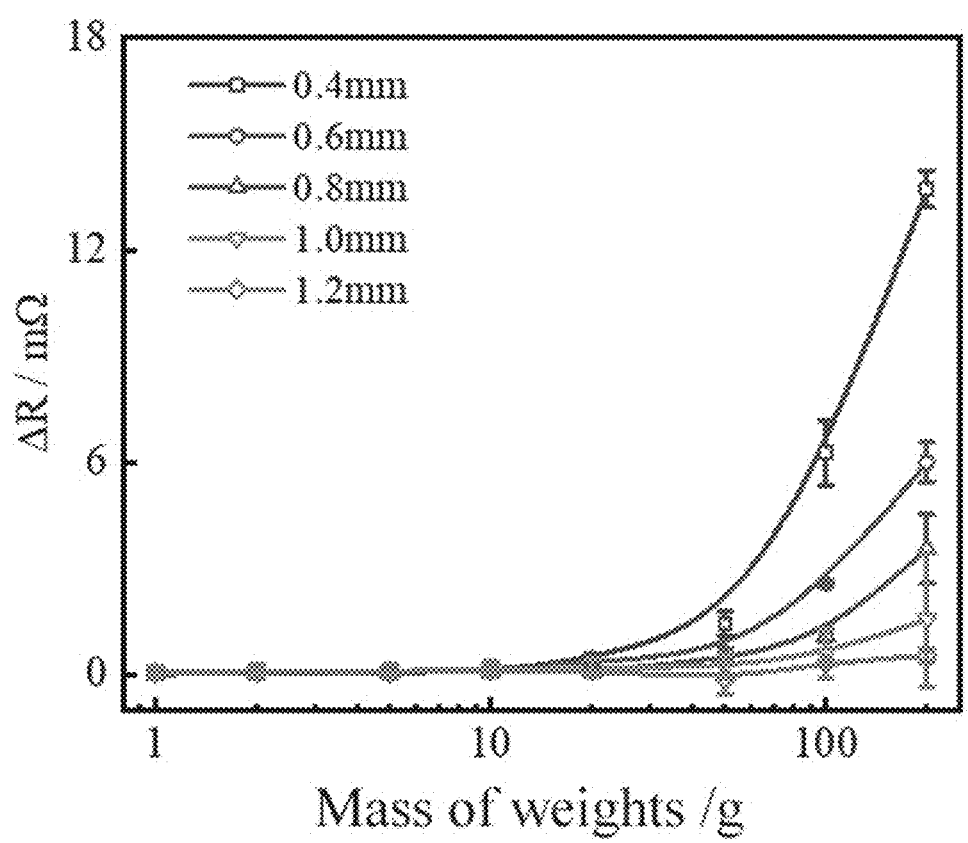
FIGS. 15A-15C show variations of circuit resistance versus the mass of weights when the liquid metal-based flexible electronic devices with different microchannel sizes prepared in Example 1 are configured in the more complex-pattern circuit with Ecoflex of different thicknesses, FIG. 15A for 0.4 mm, FIG. 15B for 0.7 mm, and FIG. 15C for 1.0 mm.
Figure 15B:
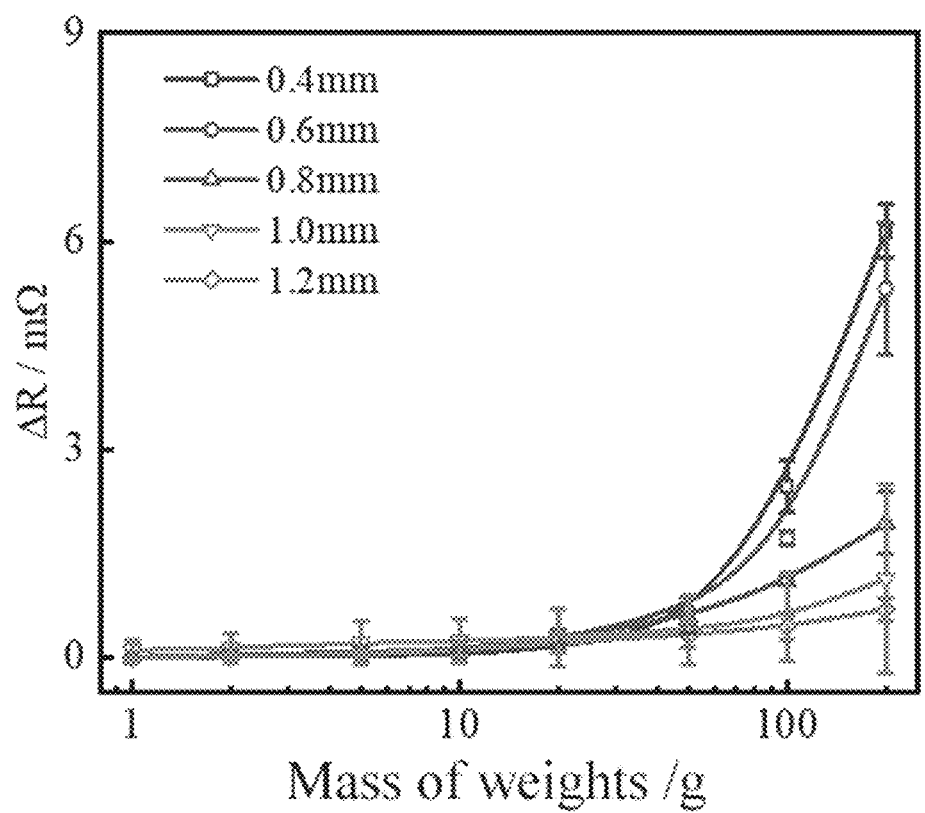
Figure 15C:
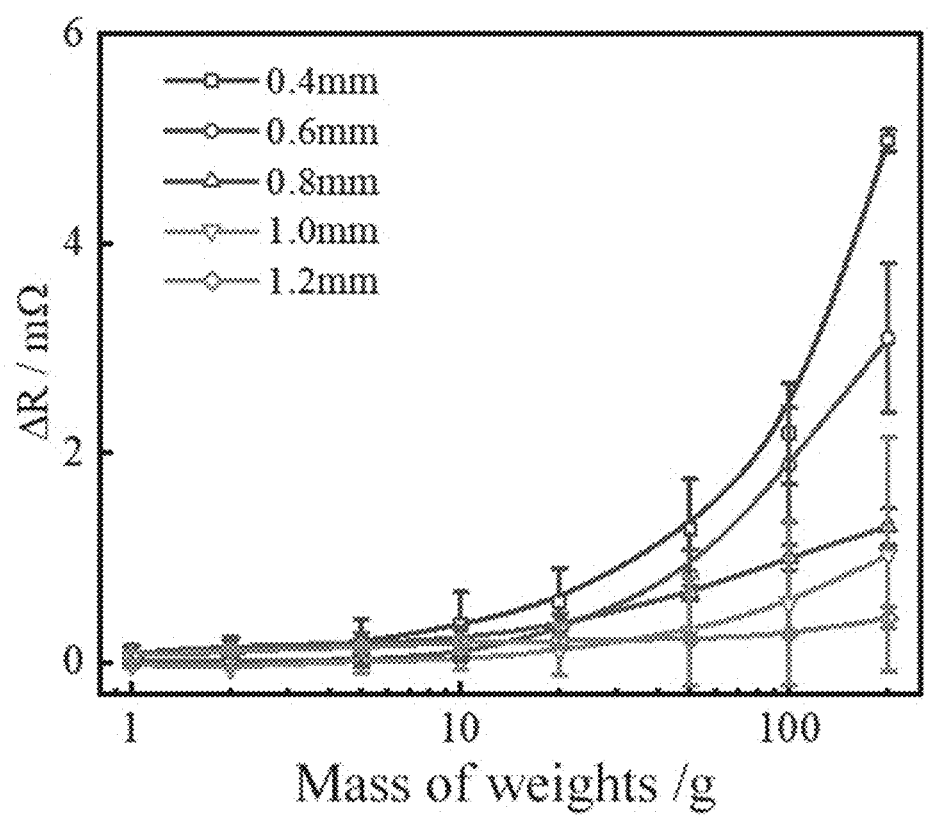

When the liquid metal-based flexible electronic devices prepared in Example 1 were pressed, the performance of the circuit was tested, and the sensitivity was measured. As shown in FIG. 11, the test process was as follows: weights of different masses were placed on the EGaIn liquid metal-based flexible circuits in turn, wherein the masses were 1 g, 2 g, 5 g, 10 g, 20 g . . . 100 g and 200 g, etc., respectively, and the microchannels in the circuits were set as 0.4 mm, 0.6 mm, 0.8 mm, 1.0 mm and 1.2 mm in size, and were set to form three patterns, i.e. simple pattern (the total length of the microchannel was 70 mm), complex pattern (the total length of the microchannel was 110 mm) and more complex pattern (the total length of the microchannel was 170 mm), as shown in FIGS. 12A-12C. For the three patterns, the lengths of the microchannels per unit area of the pressed part were 7.2 mm/cm$^2$, 13.6 mm/cm$^2$, and 23.2 mm/cm$^2$ respectively. Meanwhile, considering that the thickness of the Ecoflex layer wrapping EGaIn liquid metal may also affect the performance of the circuit, the thicknesses of Ecoflex were also set as 0.4 mm, 0.7 mm and 1.0 mm respectively. Classified according to the complexity of the circuit patterns, the changes in the circuit resistances with five microchannel sizes and different Ecoflex thicknesses with the increase in mass of weights were finally measured, as shown in FIGS. 13A to 15C. The experimental results show that the resistances of circuits with three different levels of complexity, five microchannel sizes and different Ecoflex thicknesses all increase with the increase in mass of the weights, and that with the same Ecoflex thickness, for the circuit with a smaller microchannel size, the increase in the resistance thereof as the increase in mass of the weights is greater. When the weight(s) is placed on the EGaIn-based flexible circuit with Ecoflex as substrate, because of gravity, the weight(s) squeezes Ecoflex and Ecoflex deforms, accompanying with the deformation of microchannel inside and a decrease in the cross-sectional area thereof, and the accompanying deformation of EGaIn liquid metal encapsulated therein because of good shaping ability of the EGaIn liquid metal. Therefore, the resistance of the entire circuit also increases, and when the microchannel is in a smaller size, the change of resistance caused by the cross-sectional area deformation is greater, and thus the change of the resistance is greater.

Figure 16:
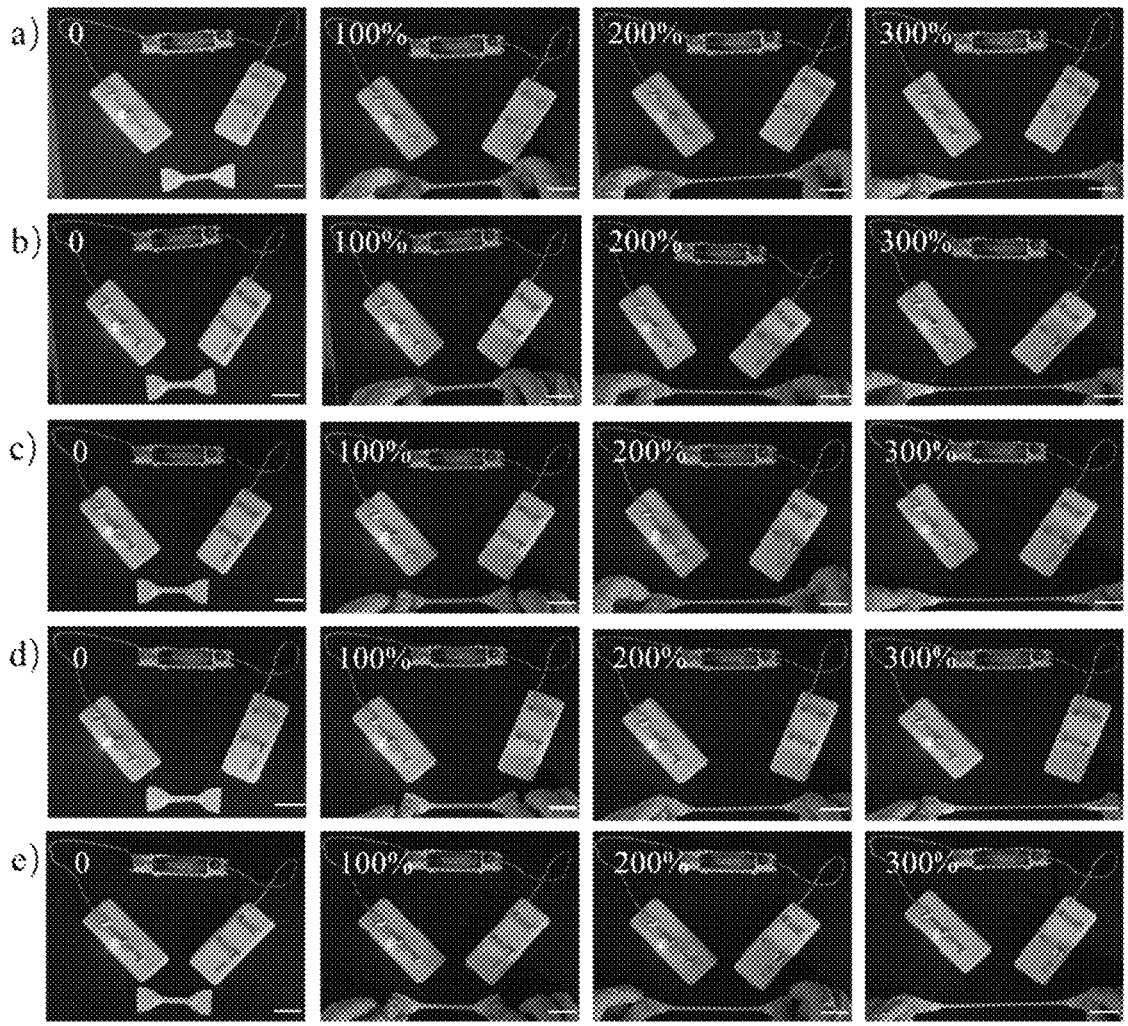
FIG. 16 shows experimental results of controlling the brightness of the bulb by stretching the liquid metal-based flexible electronic devices with different microchannel sizes as prepared in Example 1, panel a) for 0.4 mm, panel b) for 0.6 mm, panel c) for 0.8 mm, panel d) for 1.0 mm, and panel e) for 1.2 mm.

The liquid metal-based flexible electronic devices prepared in Example 1 were used as a switch for controlling the light and dark of the bulb, and a complete closed circuit was constructed, to estimate its great role in regulating the current in the circuit. The results are shown in FIG. 16. The EGaIn liquid metal is equivalent to a sliding rheostat, the resistance of the EGaIn liquid metal increases when it is stretched, so that the current in the circuit decreases, and the voltage across the bulb decreases, so the luminous brightness decreases. It can be seen that when the microchannel is in a smaller size, the brightness change of the bulb is more significant. When the circuit with a microchannel 0.4 mm in size is stretched from a strain of 0 to a strain of 300%, the bulb becomes dark and almost extinguishes, while when the circuit with a microchannel 1.2 mm in size is stretched to a strain of 300%, the brightness is only slightly weakened. Meanwhile, this also illustrates from the side that the circuit with a microchannel in a larger size could resist the influence of deformation on the circuit, thereby improving the stability of the circuit.

Figure 17:
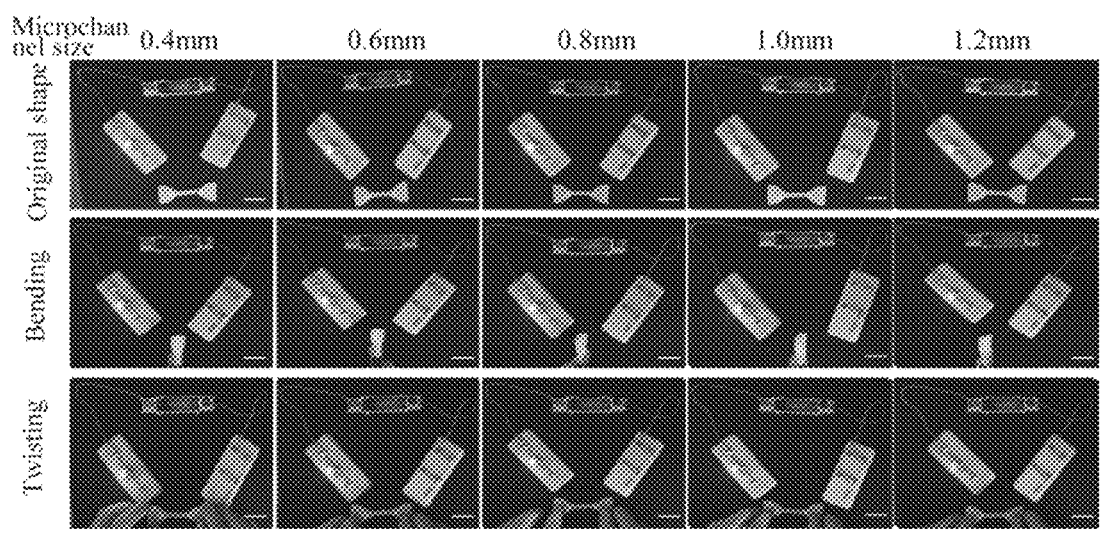
FIG. 17 shows experimental results of controlling the brightness of the bulb by bending or twisting the liquid metal-based flexible electronic devices with different microchannel sizes as prepared in Example 1, panel a) for 0.4 mm, panel b) for 0.6 mm, panel c) for 0.8 mm, panel d) for 1.0 mm, and panel e) for 1.2 mm.

The liquid metal-based flexible electronic devices prepared in Example 1 were folded 180° and twisted 360°, and the changes in the brightness of the small bulb during the bending and twisting were observed again. The results are shown in FIG. 17. From FIG. 17, it can be seen that there is almost no changes in brightness of the bulb. According to the above experimental data from the bending and twisting experiments of the circuit, the bending could at most cause an increase of about 30 mΩ in the circuit resistance, while it is much less for the twisting, only 20 mΩ, which is of a different order of magnitude from that during the stretching and completely incomparable to that during the stretching. Therefore, the voltage across the bulb is less affected by the twisting so that there is almost no change in the brightness of the bulb. This also shows that the circuit could withstand small deformations such as bending or twisting, and exhibits stability to a certain degree.

Figure 18A:
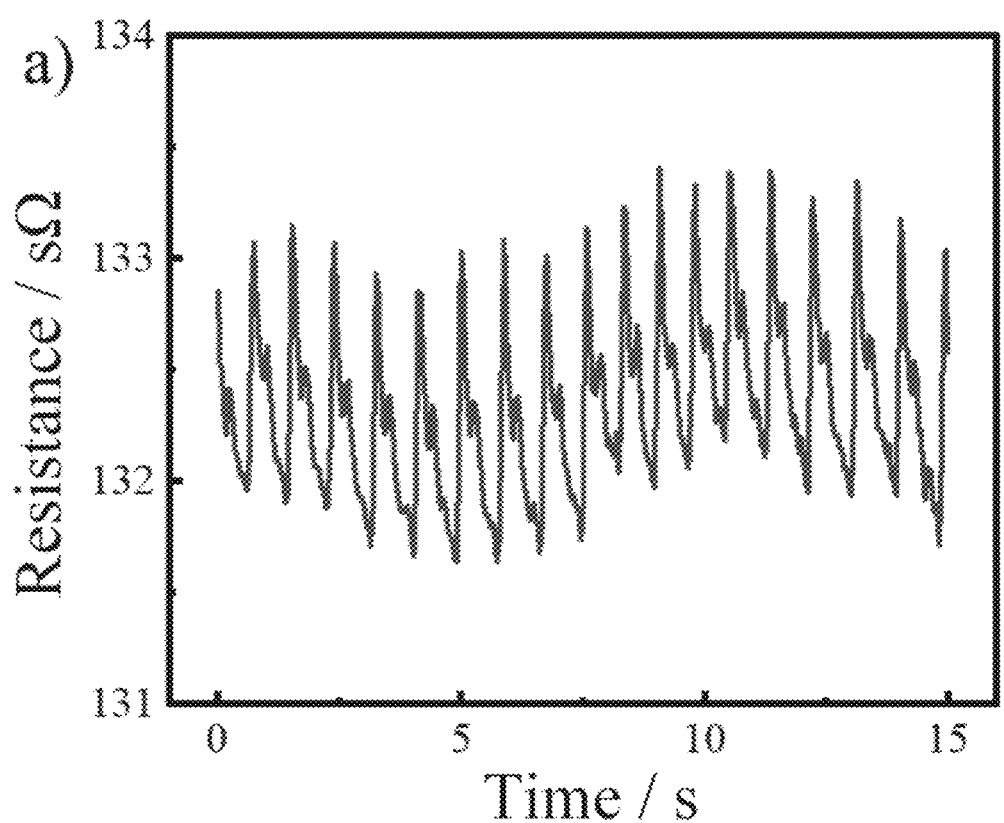
FIGS. 18A-18B show curve diagrams of human pulse measured before and after exercise, FIG. 18A of which represents before exercise.
Figure 18B:
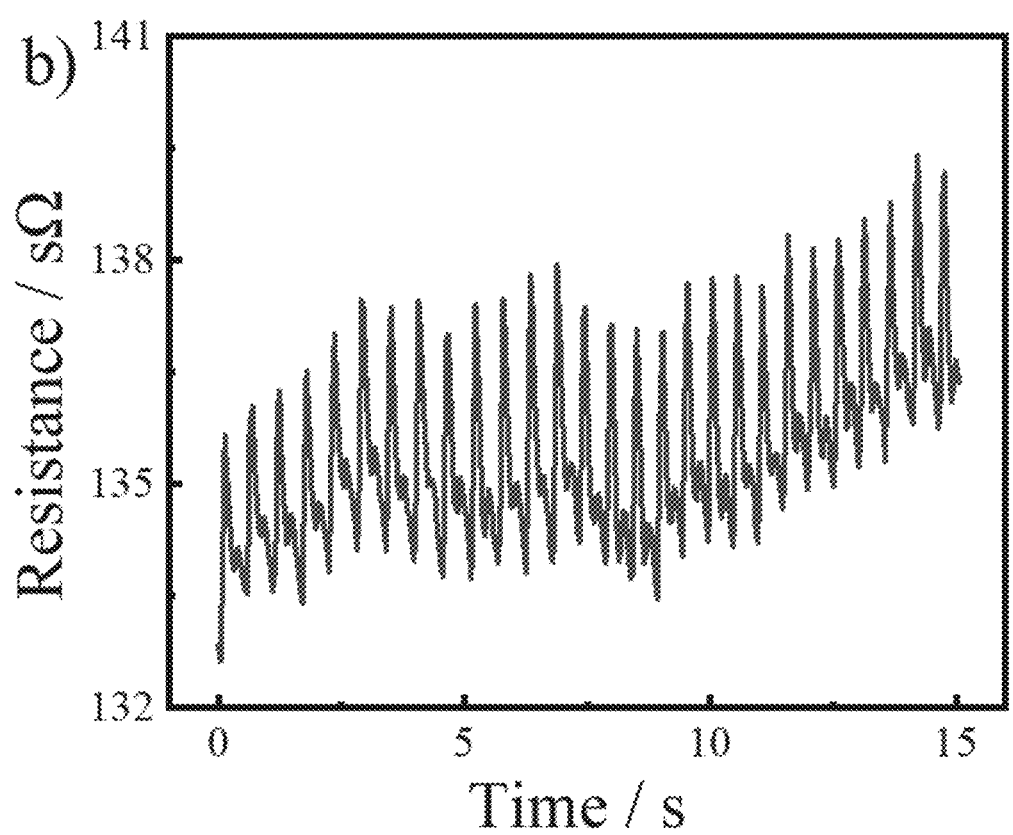

The liquid metal-based flexible electronic devices prepared in Example 1 were used for the measurement of human pulse. During the measurement, the samples were placed on a person's wrist and held down, and meanwhile the circuit resistance is measured with a multimeter. EGaIn liquid metal encapsulated by Ecoflex was squeezed by the pulse beating, and deformed, and the resistance also changed accordingly, thereby measuring the pulse. The pulse of a volunteer in a calm state before exercise was measured, and then his pulse after one minute of vigorous exercise was measured. The results are shown in FIGS. 18A-18B. In a calm state before exercise, the pulse is 72 beats/min, and one minute after the vigorous exercise, the pulse is 112 beats/min, both of which are within the normal range of the human pulse. It can also be seen that the pulse beating before exercise is gentle, and the amplitude of the curve is about 1 mΩ, while the human body pulse beats violently after exercise, and the amplitude of the curve is about 4 mΩ, which is consistent with the actual situation.

The adhesion work of the microchannels at different stages was calculated according to the Young-Dupre equation. The adhesion work after plating gold was increased from 110 mJ/m$^2$ (before plating gold) to 200 mJ/m$^2$, which increased by nearly 2 times. Therefore, the wettability was significantly improved. In summary, the obtained liquid metal-based flexible electronic devices could be stretched to a strain of 600%, bent 180°, and twisted 360°, and when being subjected to 1,000-cycle tensile tests with a strain of 100%, exhibit stable peaks and valleys in the resistance curve.

It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure all terms should be interpreted in the broadest possible manner consistent with the context. In particular the terms "comprises" and "comprising" should be interpreted as referring to the elements, components, or steps in a non-exclusive manner, indicating that the referenced elements, components, or steps can be present, or utilized, or combined with other elements, components, or steps that are not expressly referenced.

What is claimed is:

1. A method for preparing a liquid metal-based flexible electronic device, comprising
    preparing an Acrylonitrile Butadiene Styrene (ABS) plastic model by a 3D printing according to a circuit pattern;
    performing an ion sputtering on a surface of the ABS plastic model to form a gold film, to obtain a gold-plated ABS circuit;
    introducing a first silica gel into a mold to suspend the gold-plated ABS circuit inside the mold such that the gold-plated ABS circuit does not contact the mold, and curing the first silica gel to obtain a cured model;
    immersing the cured model in acetone to dissolve the ABS plastic model, to obtain a microchannel with a gold plating on an inner wall of the microchannel in a first silica gel substrate; and
    injecting a gallium-indium eutectic into the microchannel with the gold plating on the inner wall, inserting a copper wire into the gallium-indium eutectic at both ends of the microchannel with the gold plating on the inner wall, and applying a second silica gel to a port of the microchannel with the gold plating on the inner wall and curing the second silica gel such that the circuit is encapsulated, to obtain the liquid metal-based flexible electronic device.

2. The method as claimed in claim 1, wherein the ion sputtering is performed for 60-100 s.

3. The method as claimed in claim 1, wherein curing the first silica gel is performed independently for 2 to 4 hours.

4. The method as claimed in claim 1, wherein immersing the cured model in acetone is performed for 12-24 hours.

5. The method as claimed in claim 1, wherein the gallium-indium eutectic has a Ga content of 74.5 wt %, and an In content of 25.5 wt %.

6. The method as claimed in claim 1, wherein the copper wire has a length of 50-70 mm.

* * * * *

UNITED STATES PATENT AND TRADEMARK OFFICE
CERTIFICATE OF CORRECTION

| | |
|---|---|
| PATENT NO. | : 11,490,524 B2 |
| APPLICATION NO. | : 17/513766 |
| DATED | : November 1, 2022 |
| INVENTOR(S) | : Feng et al. |

It is certified that error appears in the above-identified patent and that said Letters Patent is hereby corrected as shown below:

On the Title Page

Item (73) Assignee, "Harbin Institute of Technology, Shenzen (CN)" should read --Harbin Institute of Technology, Shenzhen, Shenzhen (CN)--

Signed and Sealed this
Sixth Day of December, 2022

Katherine Kelly Vidal
*Director of the United States Patent and Trademark Office*